United States Patent [19]
Sekiguchi et al.

[11] Patent Number: 5,937,290
[45] Date of Patent: Aug. 10, 1999

[54] METHOD OF MANUFACTURING SEMICONDUCTOR INTEGRATED CIRCUIT DEVICES USING PHASE SHIFTING MASK

[75] Inventors: Toshihiro Sekiguchi, Hidaka; Yoshitaka Tadaki, Hanno; Keizo Kawakita, Ome; Katsuo Yuhara, Ibaraki-ken, all of Japan; Kazuhiko Saito, Dallas, Tex.; Shinya Nishio, Plano, Tex.; Michio Tanaka, Richardson, Tex.; Michio Nishimura, Plano, Tex.; Toshiyuki Kaeriyama; Songsu Cho, both of Ibaraki-ken, Japan

[73] Assignees: Hitachi, Ltd., Tokyo, Japan; Texas Instruments Incorporated, Dallas, Tex.

[21] Appl. No.: 08/862,992

[22] Filed: May 27, 1997

[30] Foreign Application Priority Data

May 30, 1996 [JP] Japan .................................. 8-137238

[51] Int. Cl.$^6$ .............................................. H01L 21/8242
[52] U.S. Cl. ........................... 438/238; 438/253; 438/942
[58] Field of Search .................................... 438/942–946, 438/238–256, 381–399

[56] References Cited

U.S. PATENT DOCUMENTS 5,472,900  12/1995  Vu et al. .
5,688,713  11/1997  Linliu et al. .

OTHER PUBLICATIONS

U. S. Patent No. 4,970,564, filed Nov. 1990.

JP-A-5-291532, Nov. 1993.

Primary Examiner—Jey Tsai
Attorney, Agent, or Firm—Antonelli, Terry, Stout & Kraus, LLP

[57] ABSTRACT

In an embodiment of a method of manufacturing semiconductor integrated circuit devices according to the present invention, word lines are provided in a straight form, which serve as gate electrodes of two selecting MOSFETs formed symmetrical about a center portion of an active region surrounded by a LOCOS oxide film on a semiconductor substrate, and bit lines have straight segments and protruding segments. Each protruding segment is formed to protrude from the bit line and is connected through a first contact hole to a first semiconductor region formed at the center portion of the active region. The straight line segments and the protruding segments are formed separately by two separate exposure steps.

4 Claims, 20 Drawing Sheets

METHOD OF MANUFACTURING SEMICONDUCTOR INTEGRATED CIRCUIT DEVICES USING PHASE SHIFTING MASK

BACKGROUND OF THE INVENTION

The present invention relates to a semiconductor integrated circuit device, and more particularly to a method of manufacturing a semiconductor integrated circuit device including a DRAM (Dynamic Random Access Memory).

DRAMs of recent years adopt the stack structure having an information storage capacitor arranged above a memory-cell-selecting MISFET to compensate for a decrease of stored charge (Cs) of the information storage capacitor due to the miniaturization of the memory cell.

Of all memory cells of the stack type, a memory cell of the Capacitor Over Bitline (COB) type having an information storage capacitor arranged over the bit line for input/output of information stored in the memory cell has the features: (a) the underlying level difference of the storage node of the information storage capacitor is reduced by the bit line and therefore the difficulty in the process of forming the information storage capacitors is lessened; and (b) the bit line is shielded by the information storage capacitor, making it possible to achieve a high signal to noise (S/N) ratio.

In the DRAM memory cell, two memory-cell-selecting MISFETs which share the same bit line is formed in each active region surrounded by a field insulating film. Furthermore, the bit line is connected through the first contact hole to a semiconductor region located in the center of the active region (first semiconductor region) and the storage nodes of the information storage capacitors are connected through the second contact holes to semiconductor regions located at the two end portions of the active region (second semiconductor regions).

Meanwhile, in a memory cell of the above-mentioned COB structure, after the bit line connected to the first semiconductor region, the storage node of the information storage capacitor is connected to the second semiconductor region. Therefore, if the bit line is extending right above the second semiconductor region which is to be connected to the storage node, it is impossible to connect the storage node to the second semiconductor region.

To take an example, in U.S. Pat. No. 4,970,564 issued on Nov. 13, 1990, the adopted memory cell layout is such that the active region and the bit line are so arranged as to obliquely intersect each other to avoid the presence of the bit line right above the second semiconductor region.

Only the arrangement of the active region and the bit line obliquely intersecting each other is not enough because the areas of the both end portions of the active region are decreased by the bird's beak that grows at the LOCOS structure adopted for isolation purposes. Therefore, as shown in JP-A-5-291532 laid open on Nov. 5, 1993 and the like, memory cells of the COB structure having active regions called the sea gull wings from their external appearance.

The active region of this sea gull wing structure has a shape of symmetrical sea gull wings and a plurality of the active regions of this type are arranged on a semiconductor substrate.

In the memory cells of the sea gull wing structure, the first contact hole is formed on the first semiconductor region located in the center portion of the active region which corresponds to the body of a sea gull, and at this first contact hole, the bit line and the first semiconductor region are connected together. The channel regions of the memory-cell-selecting MISFETs are located in those portions of the active region which correspond to the inner wing portions of a sea gull, and the second contact holes are formed on the second semiconductor regions which correspond to the outer wing portions of a sea gull, and at each second contact hole, the storage node of the information storage capacitor and the second semiconductor region are connected together.

A plurality of word lines are arranged substantially in parallel, and each word line being wide at portions thereof corresponding to the channel regions to secure a sufficient channel length for the memory-cell-selecting MISFETs. On the other hand, a plurality of bit lines are provided at right angles with the word lines, and each bit line has projections to completely cover the area of each first contact hole above the first semiconductor region. Furthermore, since the fabrication of the word lines and the bit lines requires the highest degree of miniaturization, a phase shift mask is sometimes used in photolithography of those lines. In this case, it is required to keep the adjacent lines apart for a constant distance, for which reason, those portions of the lines corresponding to the wide or projecting portions of the adjacent lines need to be shaped as indentations, with the result that the word lines and the bit lines are generally not straight but complicated and irregular in their profiles.

However, if the word lines and the bit lines have complicated, irregular shapes due to the use of a phase shifting mask, for example, a problem arises when the circuit is scaled down to realize progressive integration and miniaturization in recent years. This problem is described in U.S. patent application No. 08/703,067 filed on Aug. 26, 1996, assigned to the assignee of the invention in this patent application (corresponding to Korean Paten Application No. 35498/96 filed on Aug. 26, 1996 or Taiwanese Patent Application No. 84109007 filed on Aug. 29, 1995).

Specifically, the problem is that the word lines and the bit lines are patterned in such a way that large portions are made much wider and small portions are made much smaller.

FIG. 1a is a plan view showing a typical layout of the word lines, FIG. 1b is a plan view showing the formed shape of the word lines, and FIG. 1c is a plan view showing the shape of the word lines including a defect.

In the stage of layout design, the word line mask pattern 101 in FIG. 1a includes wide and narrow portions. This is because expanded portions 102 are provided in the word line mask pattern 101 to secure a sufficient channel length for the active regions and also because recessed portions 103 are provided for the neighboring expanded portions 102 to make uniform the distance between the adjacent portions, which is required when the phase shifting mask is used.

FIG. 1b shows the word lines 104 patterned using the layout pattern shown in FIG. 1a. The word lines 104 are formed by patterning a polysilicon film or a layered film, including a polysilicon film and a silicide film, as the material for the word lines. By comparison between FIG. 1a and FIG. 1b, it can be confirmed that the dilated portions 105 of the word lines 104 corresponding to the expanded portions 102 are wider than specified in layout design, and that the constricted segments 106 of the word lines 104 corresponding to the recessed portions 103 are narrower than specified in the layout design. In other words, the wide portions are patterned much wider and the narrow portions are patterned much narrower than the designed ones.

Under the circumstances, if there is a slight pattern dislocation or a little variation in the process conditions, the above-mentioned phenomena tend to occur readily, with a result that a disconnection 107 will occur in the word line 104 as shown in FIG. 1c.

Such disconnections as in the words line also occur in the bit lines. FIG. 2a is a plan view showing a typical layout pattern of bit lines, FIG. 2b is a plan view showing the bit lines patterned using the layout pattern shown in FIG. 2a, and FIG. 2c is a plan view showing the bit lines including a defect. Just as in the word lines, a disconnection 109 occurred in the bit line 108.

SUMMARY OF THE INVENTION

An object of the present invention is to suppress the occurrence of defects in a pattern formed by photolithography using a phase shifting mask.

Another object of the present invention is to prevent disconnections of word lines or bit lines in semiconductor integrated circuit devices which have been miniaturized to thereby reduce defects and increase the yield of semiconductor integrated circuit devices.

In an aspect of the present invention, a semiconductor integrated circuit device having a memory device includes a plurality of word lines formed at fixed intervals over a semiconductor substrate and functioning as gate electrodes of memory-cell-selecting transistors, a plurality of bit lines formed at fixed intervals over the semiconductor substrate and extending in such a manner as to intersect the word lines, a plurality of active regions surrounded by a field insulating film, wherein each active region includes a first semiconductor region shared by two memory-cell-selecting transistors, second semiconductor regions at both ends of the active region, and channel-forming regions located between first and second semiconductor regions. In the method of manufacturing this semiconductor integrated circuit device, the bit lines are formed by joining the straight line pattern segments and the discrete pattern segments, and the word lines are formed by straight line pattern segments or joined pattern segments.

Since the bit lines or the word lines are formed by joining straight line pattern segments and discrete pattern segments, constrictions and dilations do not occur in the bit lines and the word lines. Nor does a disconnection or a short-circuit occur in the bit lines or the word lines, which are attributable to slight variations in the process conditions. Therefore, defects can be decreased and yield can be increased in the manufacture of semiconductor integrated circuit devices.

In addition, the robustness of the exposure step is increased, so that the forming accuracy of the bit lines or the word lines can be improved close to critical patterning limits, and the degree of integration in the semiconductor integrated circuit devices can be improved.

The above and other objects of the present invention will become apparent by the description of this specification and the accompanying drawings.

BRIEF DESCRIPTION OF THE DRAWINGS

FIG. 1b is a plan view of word lines patterned by using the layout pattern in FIG. 1a.

FIG. 2b is a plan view of bit lines patterned by using the layout pattern in FIG. 2a.

DESCRIPTION OF THE PREFERRED EMBODIMENTS

Figure 1A:
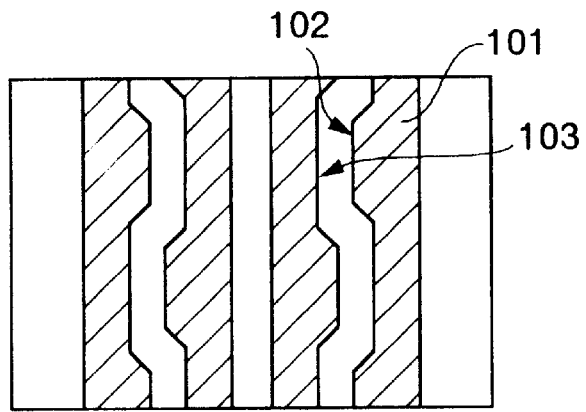
FIG. 1a is a plan view of a typical layout pattern of word lines.
Figure 1B:
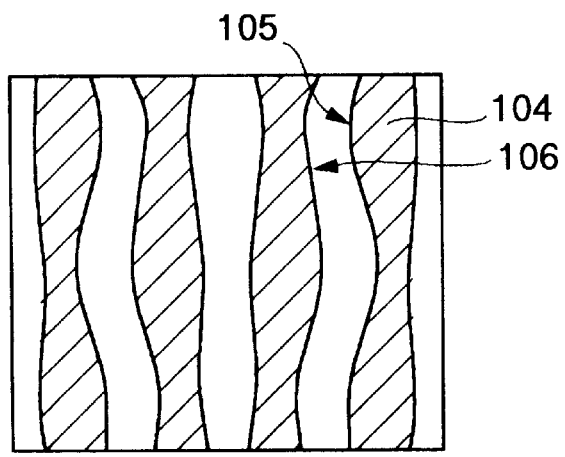
Figure 1C:
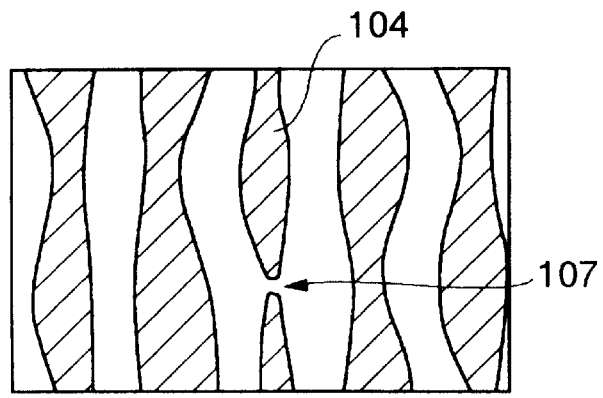
FIG. 1c is a plan view of word lines including a defect.
Figure 2A:
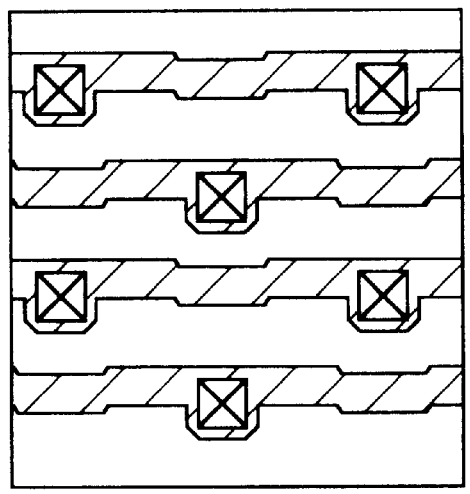
FIG. 2a is a plan view of a typical layout pattern of the bit lines.
Figure 2B:
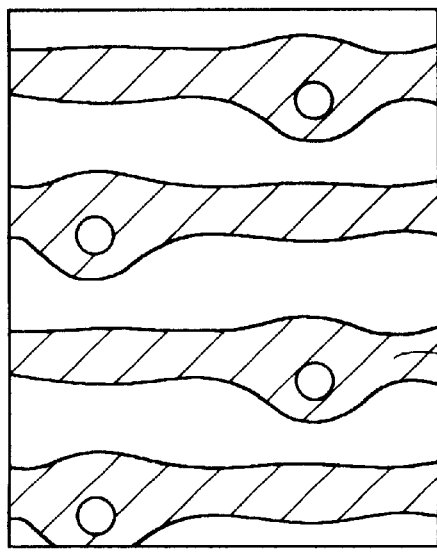
Figure 2C:
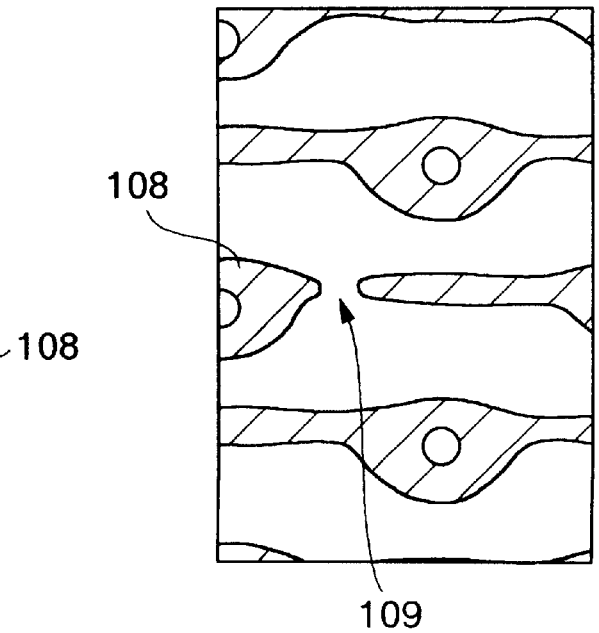
FIG. 2c is a plan view of the bit lines including a defect.

Preferred embodiments of the present invention will be described with reference to the accompanying drawings. In all drawings for illustration of the embodiments, the components having the same functions are designated by the same reference numerals, and their repetitive descriptions will be omitted.

EMBODIMENT 1

Figure 3:
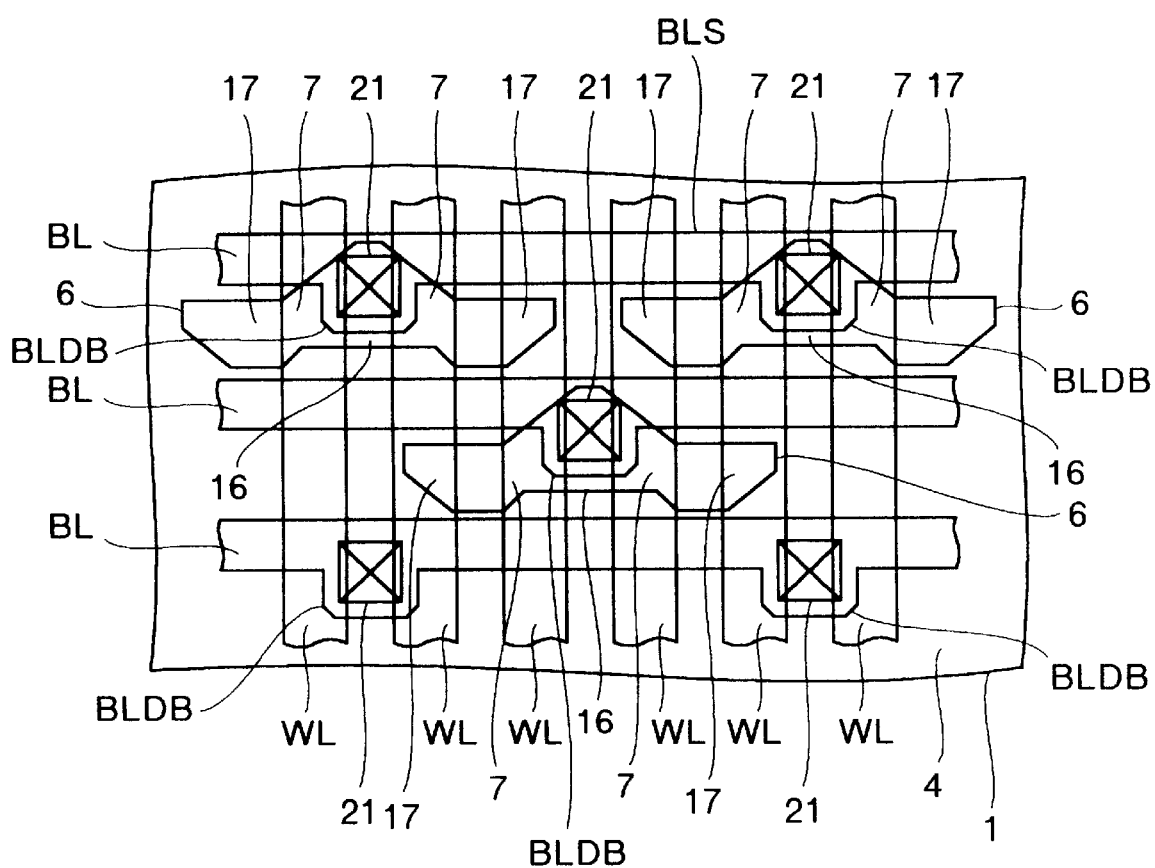
FIG. 3 is a plan view showing an example of layout of a principal portion of a part of a DRAM according to an embodiment of the present invention.

FIG. 3 is a plan view showing an example of the layout of a principal portion of a part of a DRAM according to an embodiment of the present invention.

On the main surface of a semiconductor substrate 1, an element-isolating LOCOS oxide film 4 is formed, and word lines WL serving as gate electrodes of memory-cell-selecting transistors, e.g., MISFETs are formed extending substantially at right angles with respect to generally slim (long and narrow) active regions 6 in the semiconductor substrate 1, which are surrounded by the above-mentioned LOCOS oxide film 4. The word lines WL are in a straight line and have a substantially uniform width. For this reason, the word lines are free of dilations and constrictions, which would be caused by the presence of narrow and wide portions in the pattern, and also free of disconnections or short-circuits even under near the critical limit conditions of exposure accuracy. Therefore, the degree of integration in DRAMs can be increased so that the reduction of defects and the improvement of yield can be achieved.

Each active region 6, generally slim and surrounded by the above-mentioned LOCOS oxide film 4, is symmetrical about its center portion and is divided into a first semiconductor region 16 located at the center portion of the active region 6, two second semiconductor regions 17 located at either end of the active region 6, and two channel-forming regions 7 located between the second semiconductor regions 17 and below the gate electrodes of memory-cell-selecting MISFETs.

The word lines WL over the active regions 6 have a fixed width (Lg) necessary for obtaining a threshold voltage for each memory-cell-selecting MISFET. Note that the region of the word line WL with a width of Lg is wider than the width of the active region 6 at least by the amount corresponding to the tolerance for the mask aligning dimensions in the manufacturing process.

The first semiconductor region 16 and the bit line BL are connected through a first contact hole 21 formed above the first semiconductor region 16. The second semiconductor regions 17 and storage nodes of information storage capacitors (not shown) are connected through second contact holes (not shown) formed above the second semiconductor regions.

The bit lines BL and the word lines WL are arranged substantially perpendicularly to each other. A straight line segment BLS of each bit line BL, which includes a straight line segment BLS and protruding segments BLDB is so formed as to be shifted with respect to the centers of the first contact holes 21 so that the straight line segment does not lie on the second contact holes. On the other hand, the protruding segments BLDB completely cover the first contact holes 21. Here, the "straight line" of the "straight line segment" or the "straight line pattern" mentioned hereafter means that the both edges in the longitudinal direction of each of the slender strips on a photomask are straight lines parallel with each other.

If the bit lines BL have protruding segments BLDB, as mentioned above, a short-circuit defect is likely to occur between a protruding segment BLDB of a bit line BL and an adjacent bit line BL, or a disconnection defect is likely to occur in the bit lines BL, in the conventional forming method. In the present invention, however, the exposure step is performed separately for the straight line segments BLS and the protruding segments BLDB of the bit lines BL as will be described later, and therefore such defects as mentioned above do not occur. Furthermore, it was heretofore necessary to separate the straight line segments BLS of the bit lines BL and the protruding segments BLDB of the adjacent bit lines BL by a distance larger than the critical limits of the exposure resolution. In the present invention, however, it is possible to perform the exposure step only with the straight line segments BLS of the bit lines BL in the form of "straight lines", so that the straight line segments BLS can be formed with an accuracy in the neighborhood of the critical limits of exposure resolution.

A method of manufacturing memory cells of a DRAM mentioned above will be described with reference to FIGS. 4a, 4b to 18. In FIGS. 4a, 4b to 14a, 14b, FIGS. 4a to 14a are plan views of memory cells of the DRAM, while FIGS. 4b to 14b are sectional views of memory cells of the DRAM.

Figure 4A:
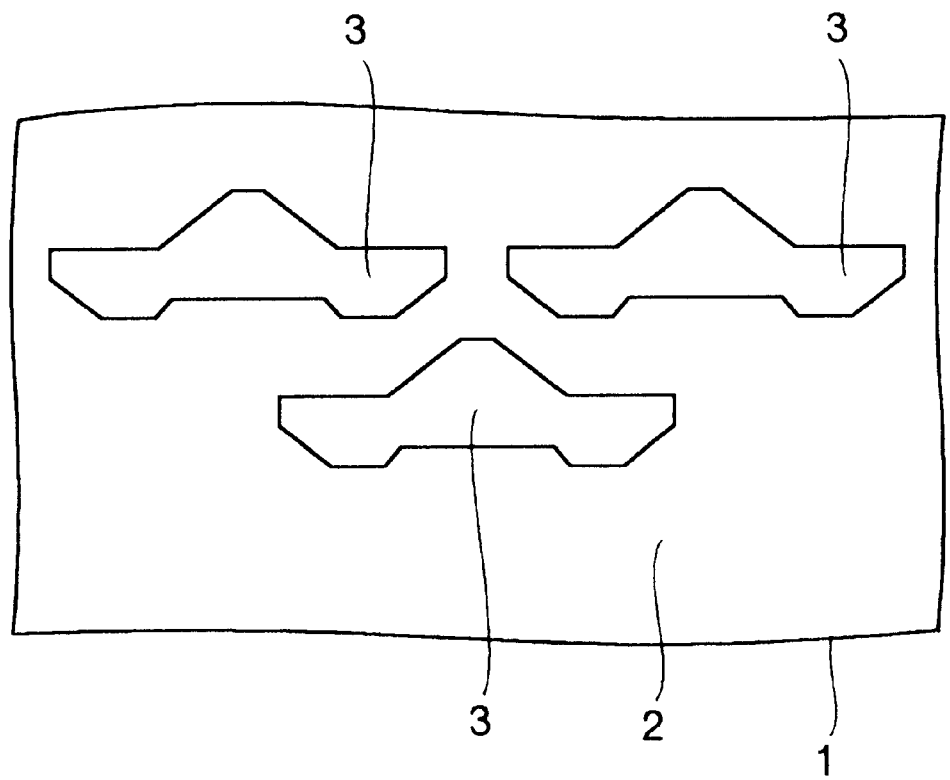
FIGS. 4a, 4b, 5a, 5b, 6a, 6b, 7a, 7b, 8a, 8b, 9a, 9b, 10a, 10b, 11a, 11b, 12a, 12b, 13a, 13b, 14a, 14b and 15 to 18 are plan views and sectional views at various manufacturing steps of a semiconductor integrated circuit device according to a first embodiment of the present invention.
Figure 4B:
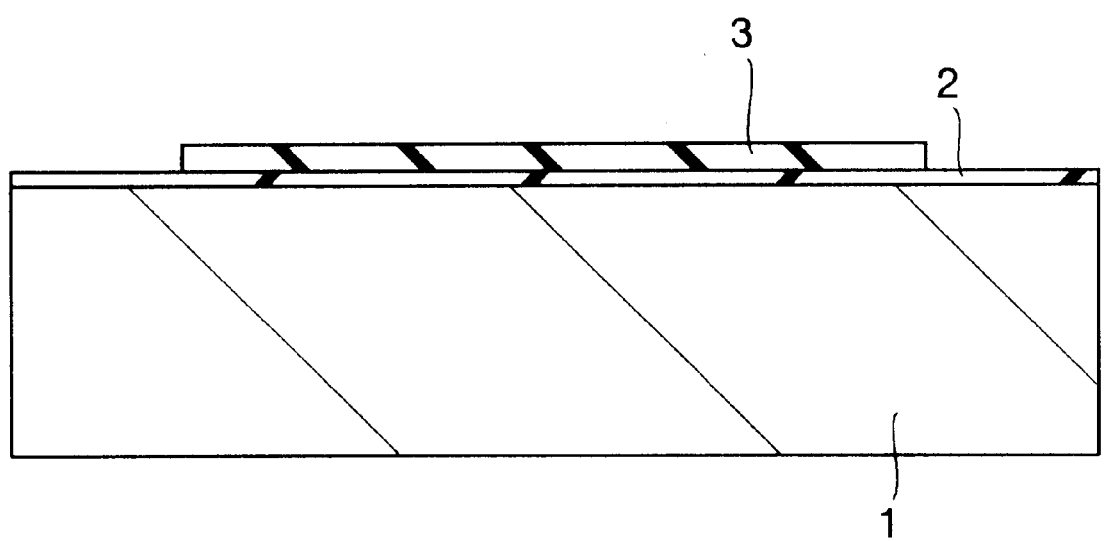

As shown in FIGS. 4a and 4b, the surface of the semiconductor substrate 1 formed of p-type silicon single crystal is subjected to thermal oxidation to form a silicon dioxide film 2, then a silicon nitride film 3 is deposited by the CVD process. The thickness of the silicon dioxide film is 13 nm, for example, and the thickness of the silicon nitride film is 140 nm, for example.

Next, using a photoresist as the mask, the silicon nitride film 3 in the regions, where a LOCOS oxide film 4 is to be subsequently formed on the semiconductor substrate 1, are etched away.

Figure 5A:
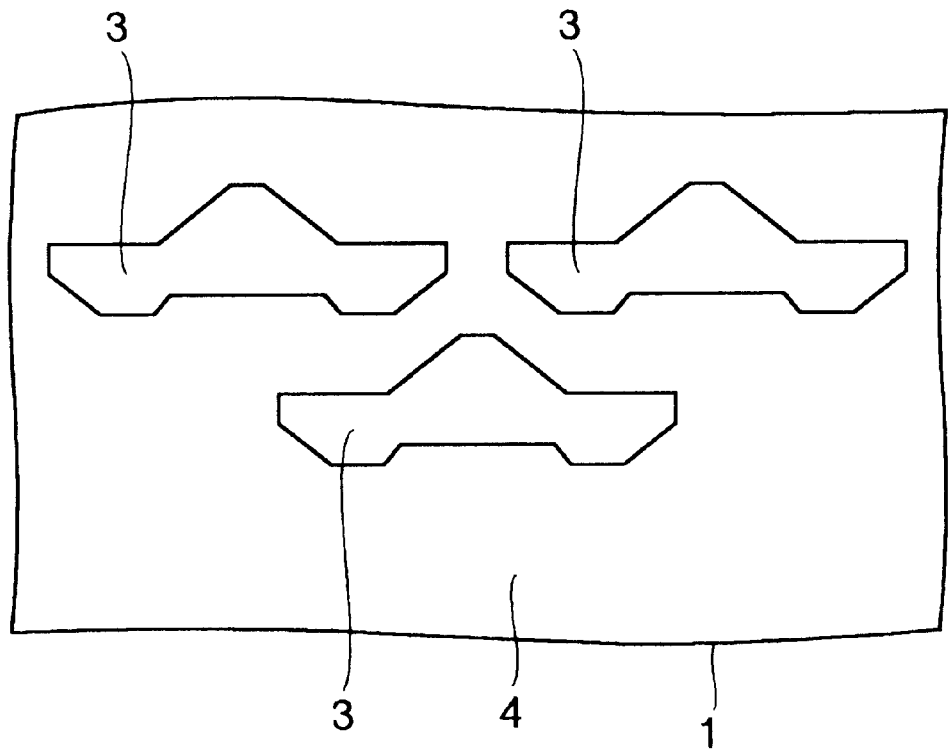
Figure 5B:
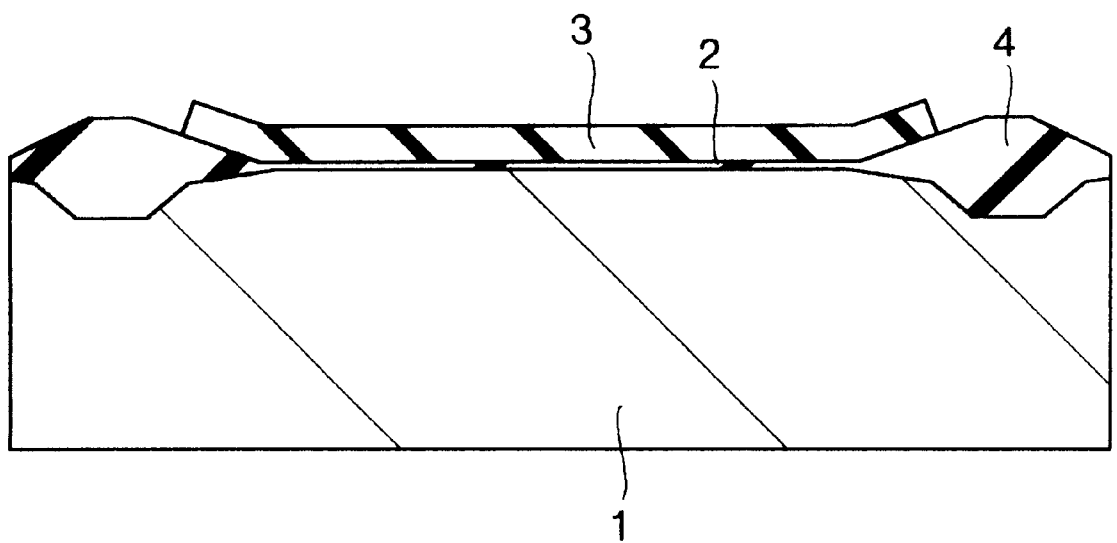

Then, as shown in FIGS. 5a and 5b, after the above-mentioned removal of the photoresist is finished, by using the patterned silicon nitride film 3 as the mask, selective oxidation is performed to form a LOCOS oxide film 4 for isolation purposes on the main surface of the semiconductor substrate 1. The LOCOS oxide film 4 is a silicon dioxide film about 400 nm thick.

Figure 6A:
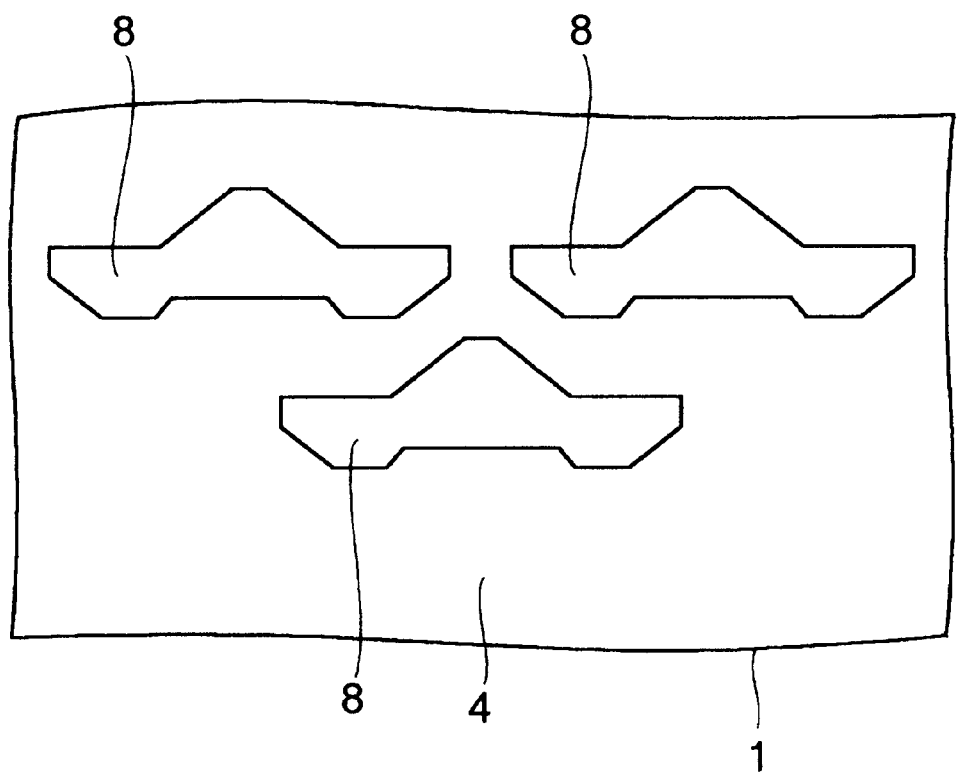
Figure 6B:
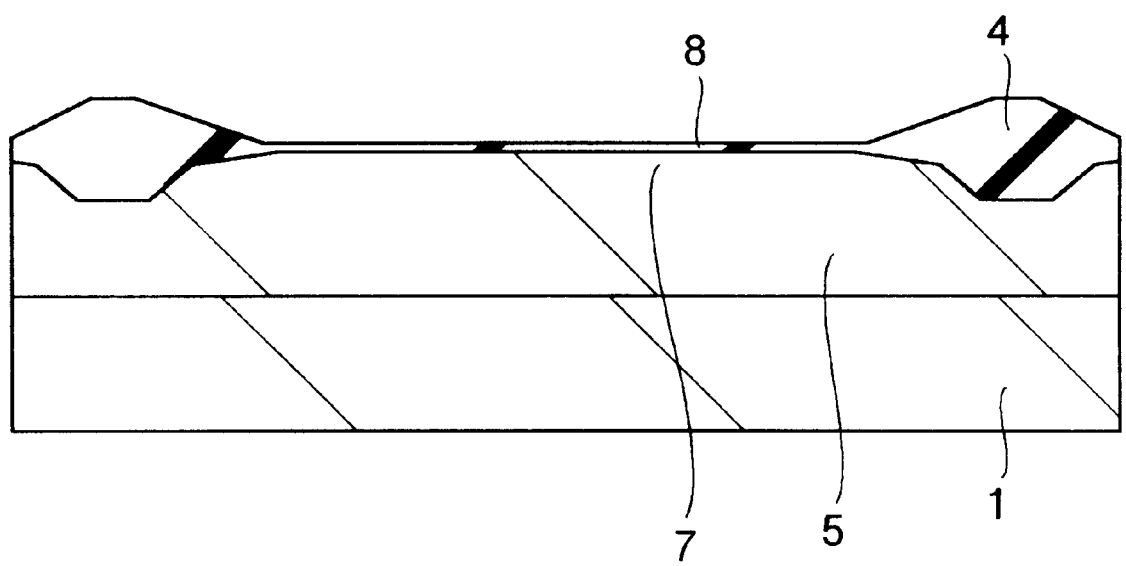

Next, as shown in FIGS. 6a and 6b, after the silicon nitride film 3 is removed by a solution of hot phosphoric acid, by using a photoresist as the mask, ions of p-type impurity (boron fluoride BF$_2$, for example) are introduced into the regions of the semiconductor substrate 1 where a memory cell array is to be formed, and after the photoresist is removed, the semiconductor substrate 1 is subjected to thermal diffusion to form p-type well regions 5.

Subsequently, after the silicon dioxide film 2 is removed by etching the surface of the semiconductor substrate 1 with a solution of hydrofluoric acid, a silicon dioxide film (not shown) is formed to a thickness of about 10 nm on the surface of the semiconductor substrate 1. Then, to obtain a desired threshold voltage of memory-cell-selecting MISFETs by optimizing the impurity concentration in the channel regions 7, ions of a p-type impurity (boron fluoride BF$_2$) are implanted into the main surface of the active regions of the p-type well region 5 through the above-mentioned silicon dioxide film, not shown.

Then, after the silicon dioxide film is removed by etching the surface of the semiconductor substrate 1 with a solution of hydrofluoric acid, regions of a gate insulating film 8 of memory-cell-selecting MISFITs are formed on the surface of the semiconductor substrate 1. This gate insulating film 8 is formed by the thermal oxidation method to a thickness of about 9 nm.

Figure 7A:
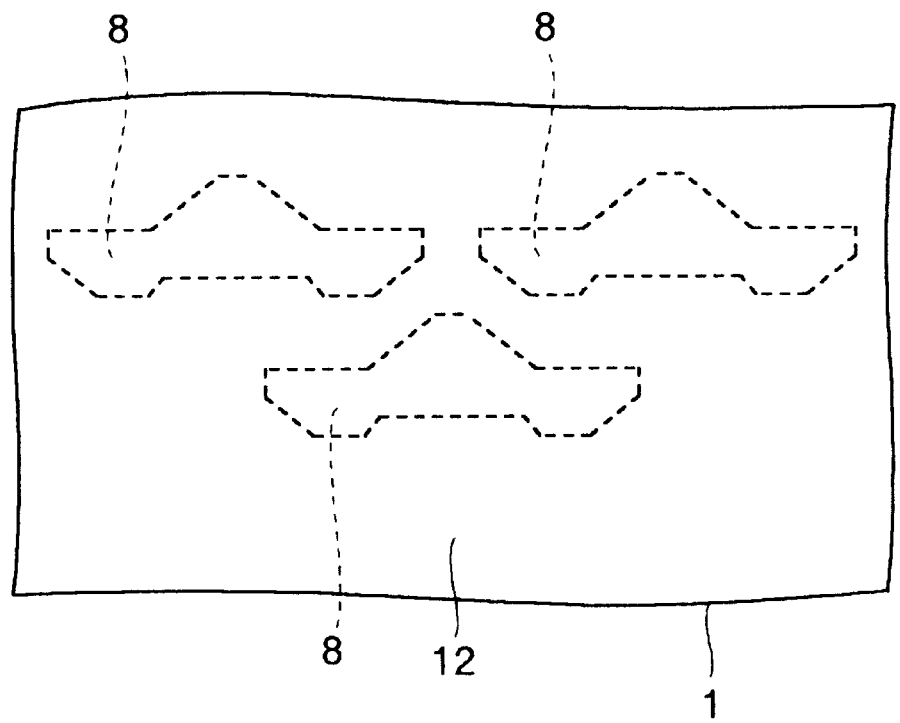
Figure 7B:
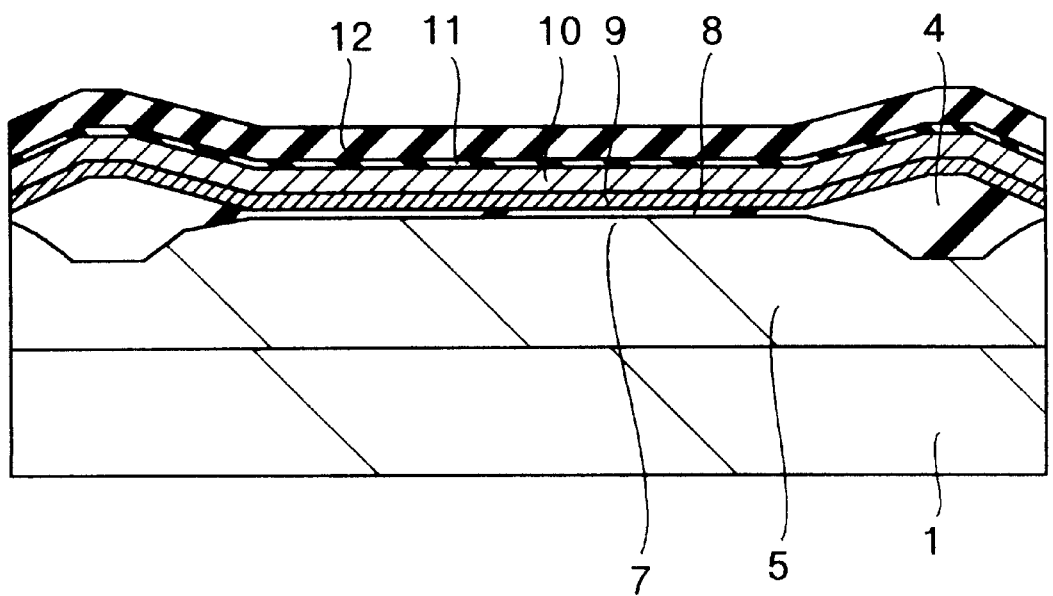

Then, as shown in FIGS. 7a and 7b, a phosphorus doped polysilicon film 9 and a tungsten silicide (WSi$_2$) film 10 are deposited in this order on the entire surface of the semiconductor substrate 1. The polysilicon film 9 and the WSi$_2$ film 10 are deposited by the CVD process, and their thickness is 70 nm and 150 nm, respectively. After this, an insulating film 11 of silicon dioxide and a silicon nitride film 12 are deposited successively on the WSi$_2$ film 10. The insulating film 11 and the silicon nitride film 12 are deposited by the CVD process to a thickness of, for example, 10 nm and 200 nm, respectively.

Figure 8A:
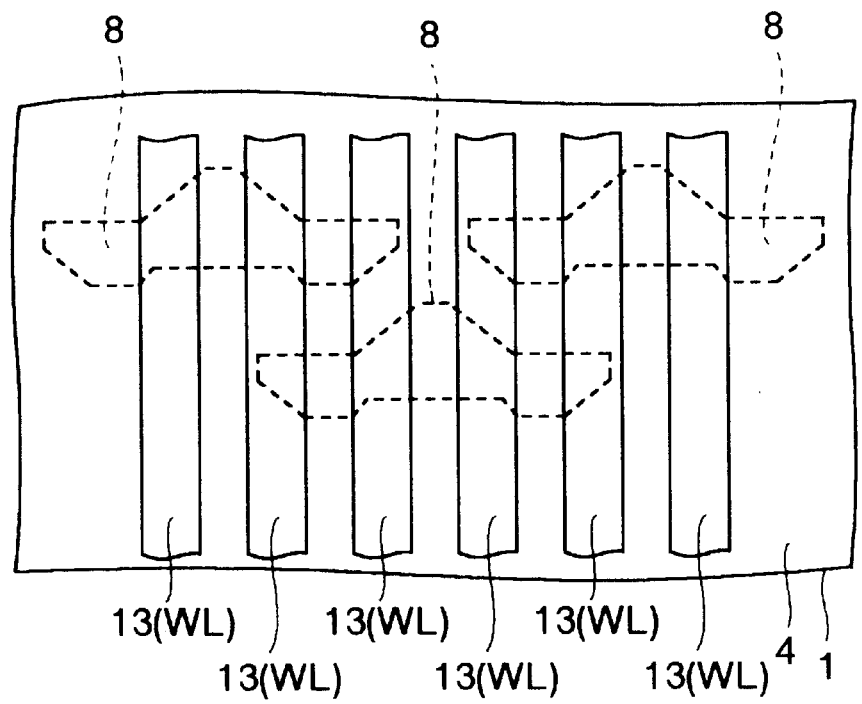
Figure 8B:
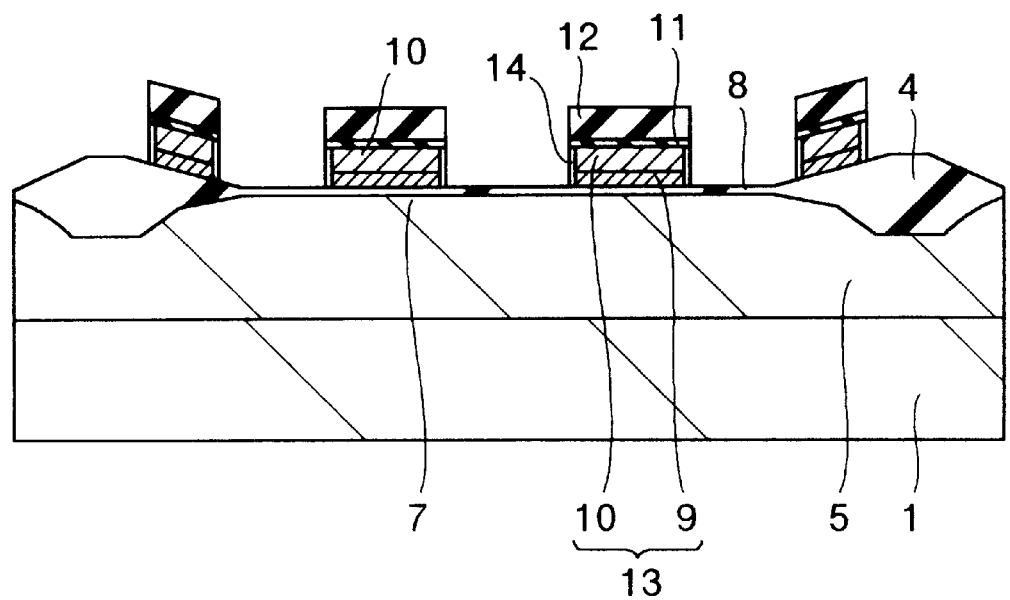

Then, as shown in FIGS. 8a and 8b, using a photoresist as the mask, a multilayered film, including the silicon nitride film 12, the insulating film 11, the WSi$_2$ 10 and the polysilicon film 9, is etched by etching those films in this order to form gate electrodes 13, including the polysilicon film 9 and the WSi$_2$ 10, of the memory-cell-selecting MISFITs.

In this etching step, the pattern, including the silicon nitride film 12, the insulating film 11, the WSi$_2$ film 10 and the polysilicon film 9, is transferred from the "straight line" pattern of the photomask. Therefore, it is possible to form the pattern with high accuracy without dilations or constrictions of the pattern due to interactions between exposing light beams of the adjacent segments of the pattern.

Then, after the above-mentioned photoresist is removed, the thermal oxidation process is performed on the semiconductor substrate 1 to form a thin silicon dioxide film 14 on the sidewalls of the polysilicon film 9 and the WSi$_2$ film 10 which are the component films of the gate electrodes 13.

Figure 9A:
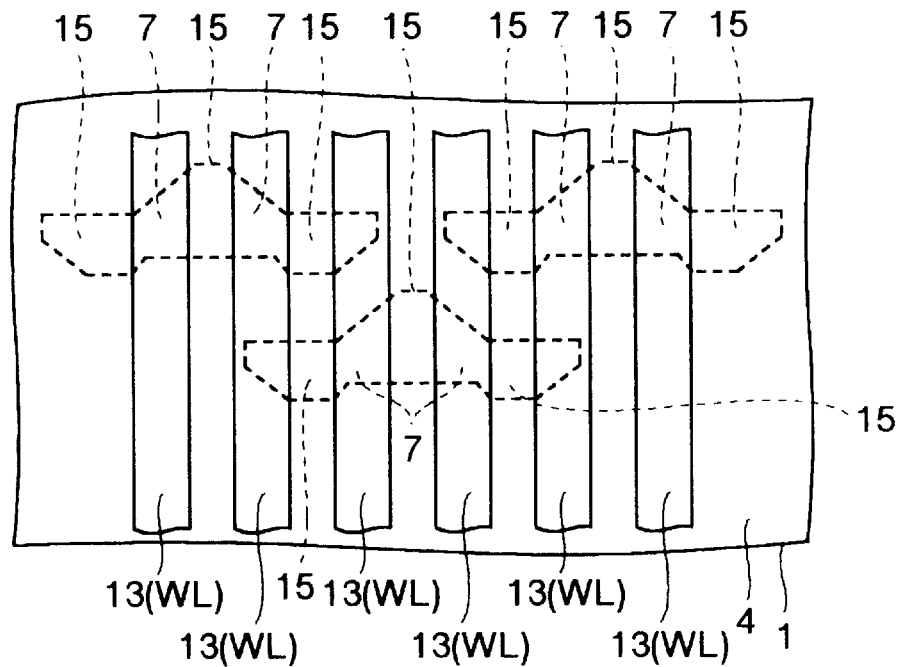
Figure 9B:
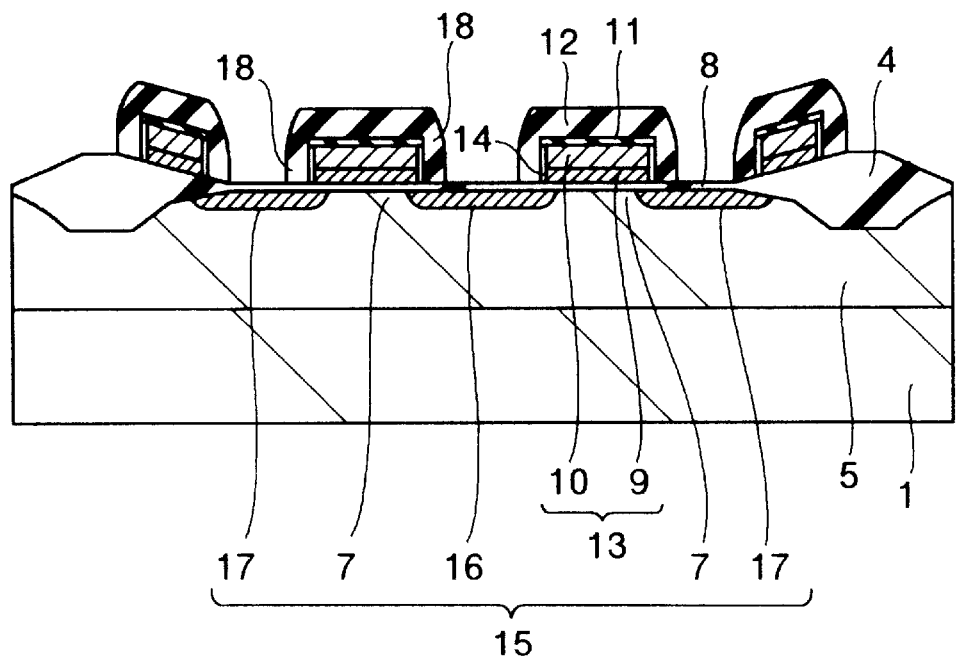

After this, as shown in FIGS. 9a and 9b, ions of an n-type impurity (P, for example) are injected into the main surface of the p-well region 5 through the above-mentioned patterned multilayered film used as the mask, and by diffusing the n-type impurities, n-type semiconductor regions (the source and drain regions) 15 of MISFETs for selecting memory cells is formed.

The n-type semiconductor region 15 includes first semiconductor region 16 located in the center of the active region and two second semiconductor regions 17. The two second semiconductor regions 17 are located at either end of the active region and have the first semiconductor region 16 and the MISFET channel regions 7 placed between them. Subsequently, the bit line BL is connected to the first semiconductor region 16 and the storage nodes of the information storage capacitors are connected to the second semiconductor regions 17.

Thereafter, anisotropic etching, such as RIE (Reactive Ion Etching), is performed on the silicon nitride film deposited by the CVD process on the semiconductor substrate 1 to form sidewall spacers 18 on the sidewalls of the gate electrodes 13 of the memory-cell-selecting MISFETs.

Note that the purpose of providing the silicon nitride film 12 on the gate electrodes 13 of the memory-cell-selecting MISFETs and providing the sidewall spacers 18 formed by the silicon nitride film deposited on the sidewalls of the gate electrodes 13 is to electrically isolate the gate electrodes 13 from conductive layers to be formed on the gate electrodes 13. The insulating films on the gate electrodes 13 are provided to prevent the gate electrodes from contacting the silicon nitride films 12 placed above the gate electrodes. The silicon dioxide films 14 are provided to prevent the gate electrodes 13 from contacting the sidewall spacers 18 formed by the silicon nitride film.

After the sidewall spacers 18 are formed, arsenic (As) ions of higher concentration than that of the n-type impurities (P) may be implanted into the main surface of the p-well region 5 to form lightly doped drain structures (LDD) for use as the source region and the drain region of the memory-cell-selecting MISFETs.

Figure 10A:
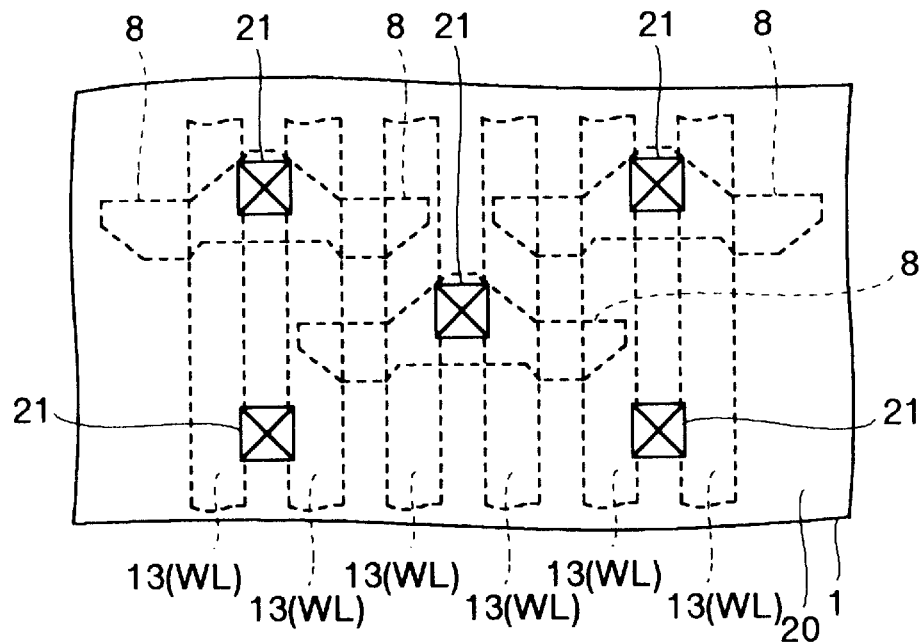
Figure 10B:
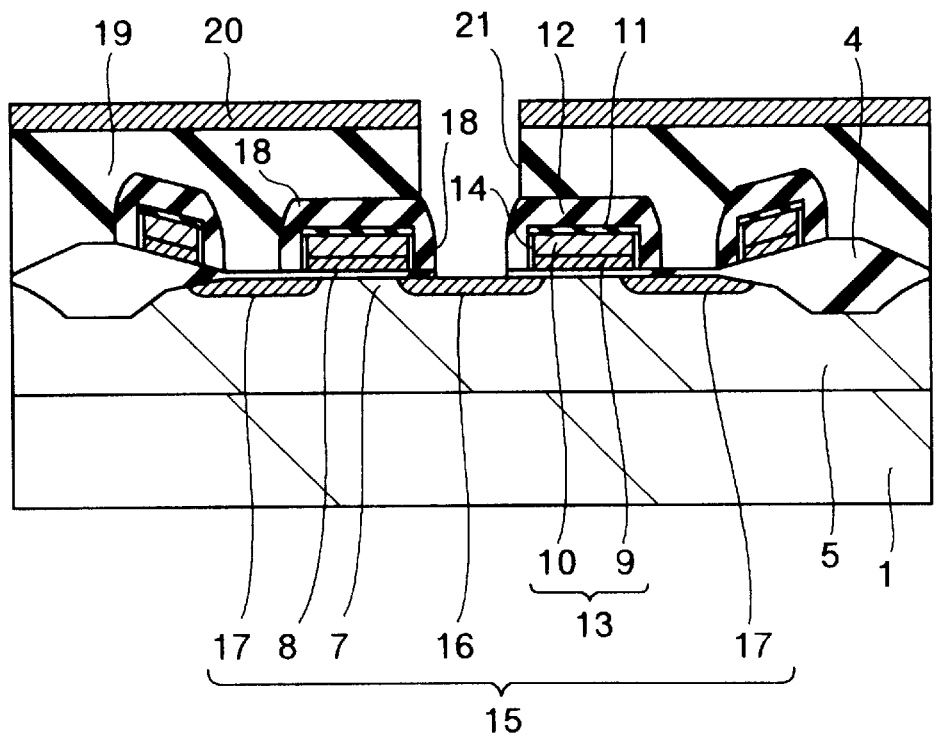

Then, as shown in FIGS. 10a and 10b, after an insulating film 19 formed by a silicon dioxide film is deposited on the semiconductor substrate 1, this insulating film 19 is flattened by a chemical mechanical polishing (CMP) method, for example, and then a p-type doped polysilicon film 20 is deposited on the semiconductor substrate 1. After that, the polysilicon film 20, the insulating film 19 and a portion of the gate insulating film 8 are etched sequentially using a photoresist as the mask to form a first contact hole 21 above the first semiconductor region 16 shared by the two memory-cell-selecting MISFETs.

Figure 11A:
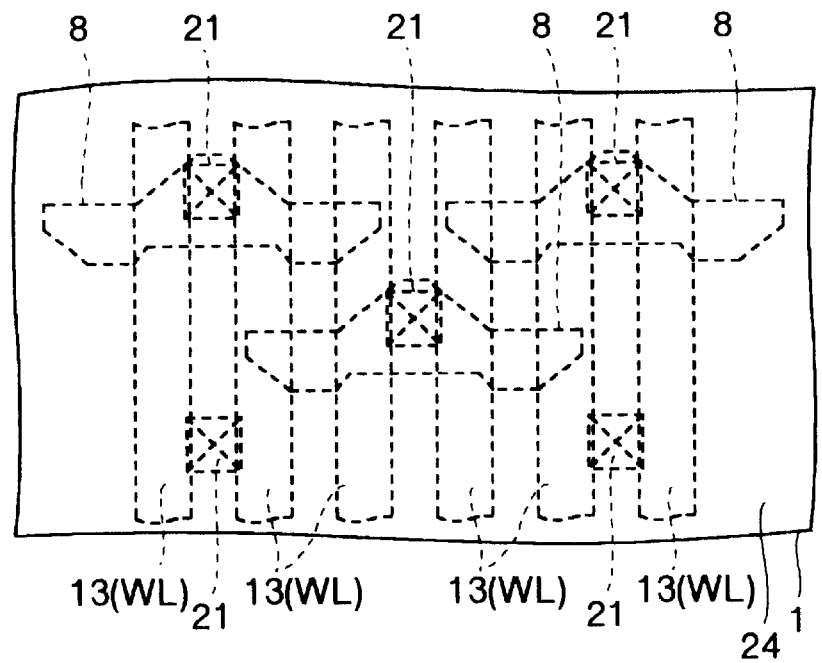
Figure 11B:
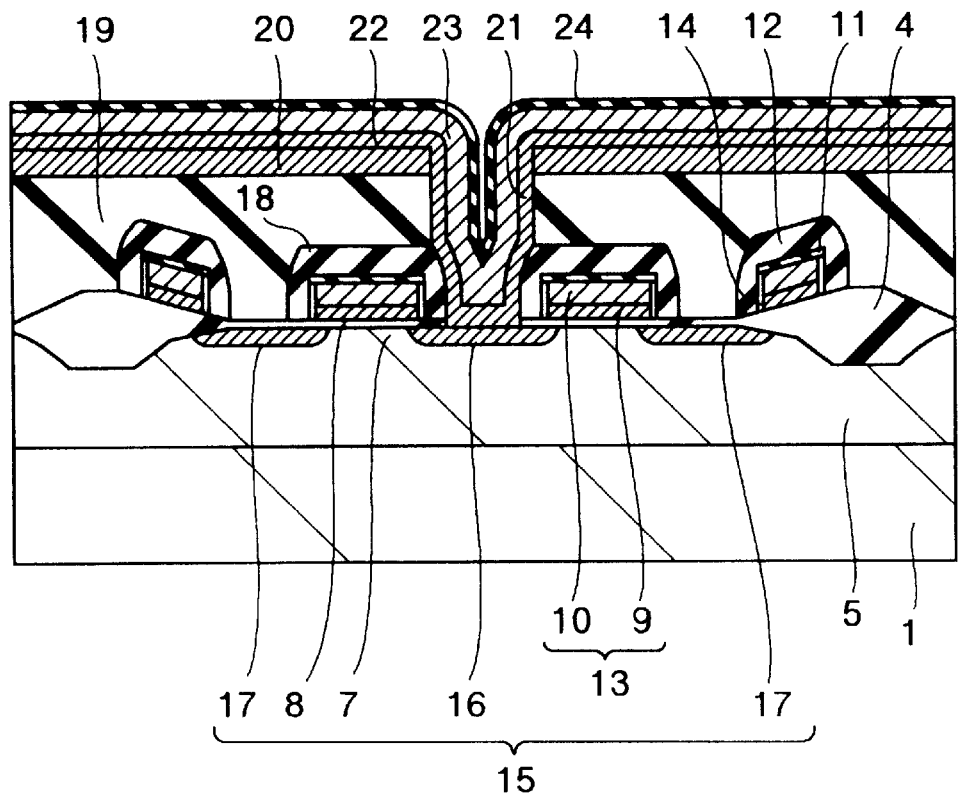

Thereafter, as shown in FIGS. 11a and 11b, after the photoresist mentioned above is removed, a phosphorus doped polysilicon film 22, a WSi$_2$ 23 and a silicon dioxide film 24 are deposited sequentially on the semiconductor substrate 1 by the CVD process. The silicon dioxide film 24 is used as a part of the mask in subsequent etching of the polysilicon film 22 and the WSi$_2$ film 23, and therefore has a low etch rate.

Figure 12A:
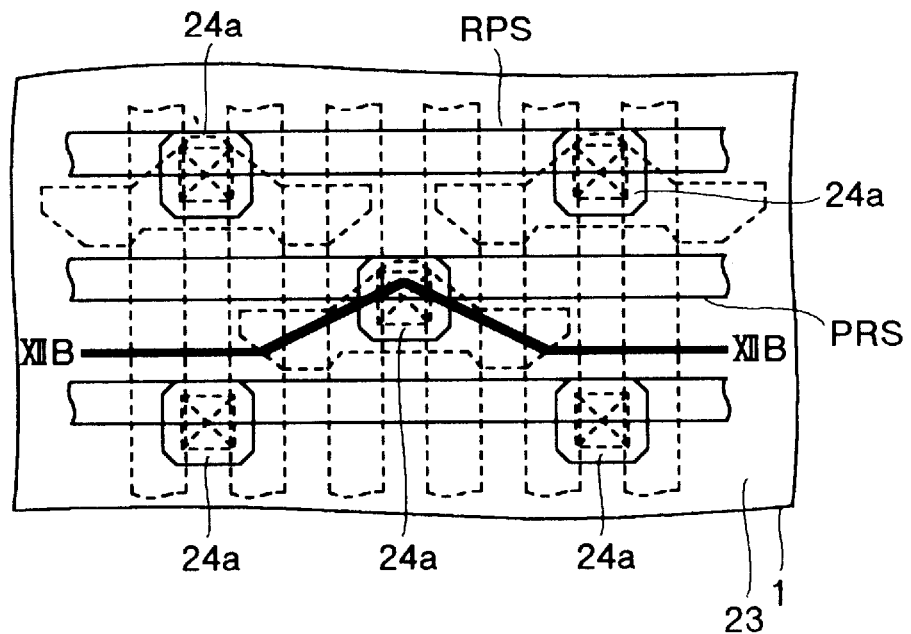
Figure 12B:
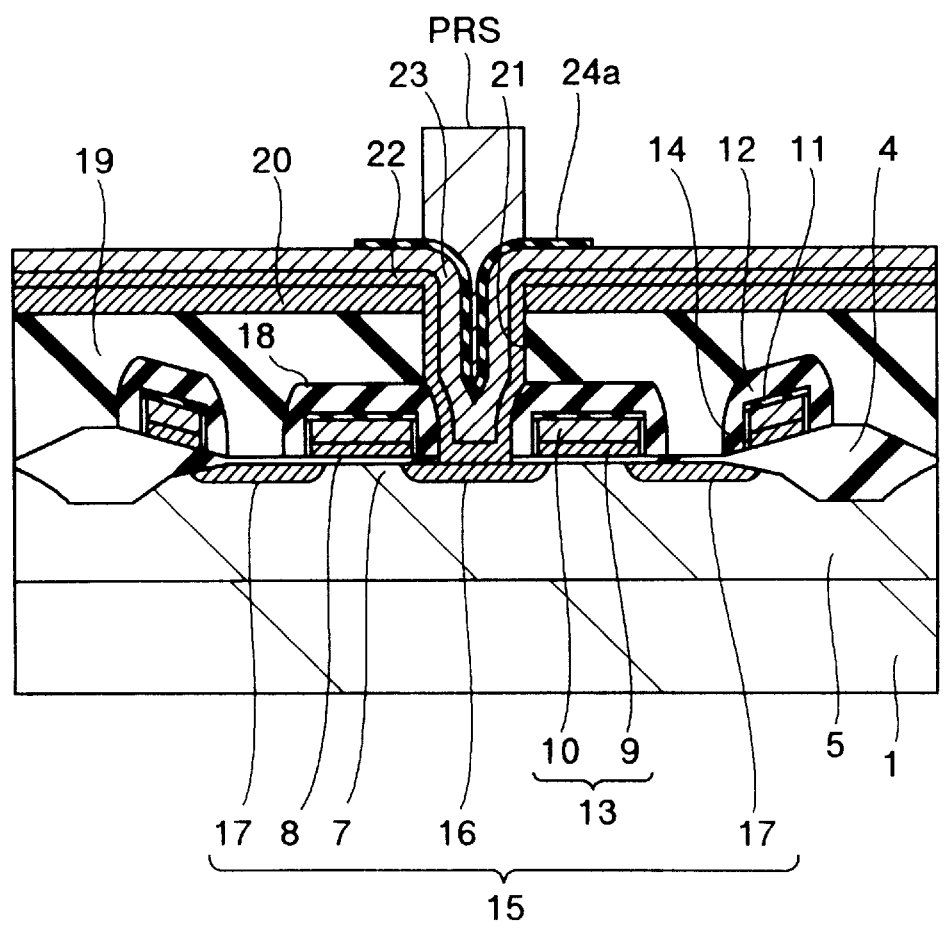

Then, as shown in FIGS. 12a and 12b, the silicon dioxide film 24 is etched to form discrete segment pattern 24a by using as a mask the photoresist which was patterned by a first exposure with a first mask having a pattern of discrete segments. The discrete segment pattern 24a is used as a mask for protruding segments BLDB of the bit Lines BL. This etching step leaves those regions of the silicon dioxide film 24 which correspond to the segments 24a in FIG. 12a. FIG. 12b is a sectional view taken along the line XII—XII in FIG. 12a.

In the first exposure step, generally the spaces between the discrete segments are sufficiently wider than the exposure resolution, so that the problem of pattern reproducibility hardly occurs at a pattern formation with a phase shift mask.

After the photoresist used in the first exposure is removed, a new layer of photoresist is deposited on the discrete segments 24a and a second exposure is performed with this photoresist through a second mask having only the straight line segments BLS of the bit lines BL shown in FIG. 3.

A subsequent develop step leaves a pattern (straight line photoresist segments) RPS only corresponding to the straight line segments BLS of the bit lines shown in FIG. 3. The second mask used is a phase shift mask.

Each of the straight line pattern segments have their side edges which are straight lines parallel with each other.

Prior to the second exposure mentioned above, the second mask is aligned so that the straight line segments on the second mask, when projected to the semiconductor substrate, partially laps over the discrete segments 24a as shown in FIG. 12a.

Needless to say, it is possible to reverse the order of the first and second exposures.

Figure 13A:
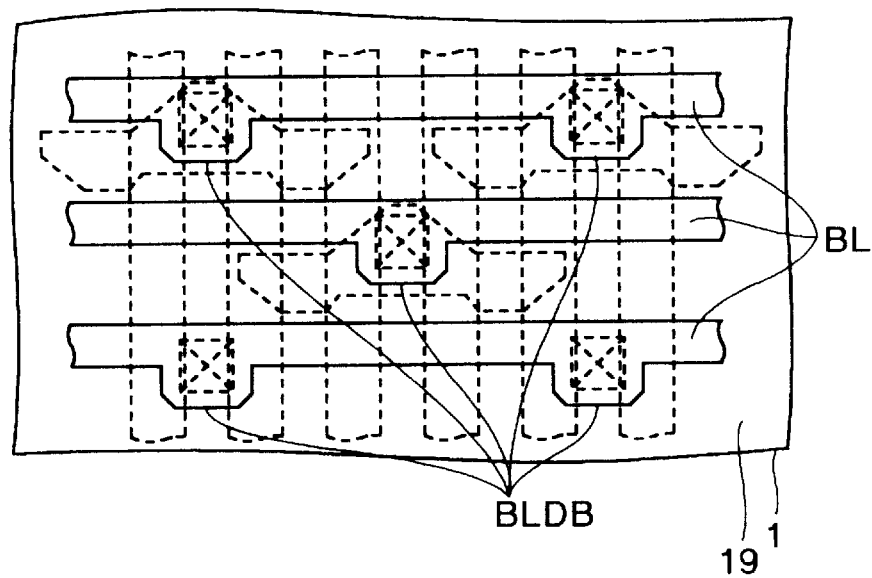
Figure 13B:
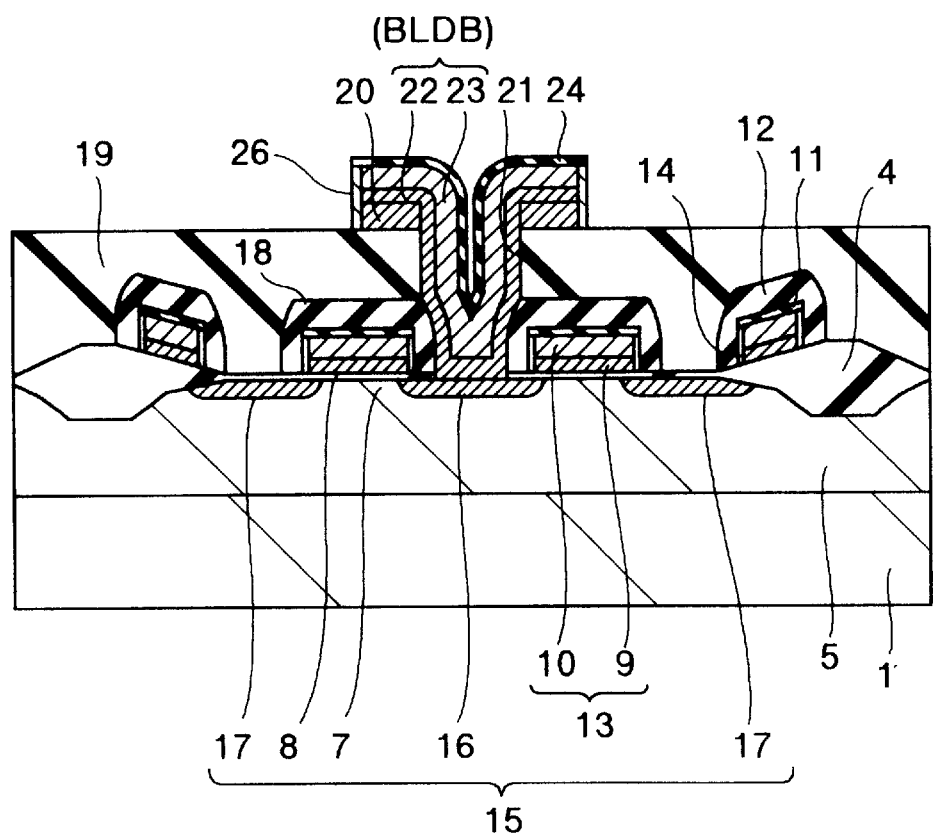

Subsequently, as shown in FIGS. 13a and 13b, using the straight line segments of resist by the second exposure and the discrete segments 24a of silicon dioxide as s mask, the stacked-layer film, including the WSi$_2$ film 23 and the polysilicon film 22, and the polysilicon film 20 are etched sequentially to form the bit lines BL, comprising the polysilicon films 20 and 22 and the WSi film 23. The bit line BL is connected through the first contact hole 21 to the first semiconductor region 16 shared by each set of the memory-cell-selecting MISFETs.

The bit lines BL comprise the straight line segments BLS and the protruding segments BLDB. The straight line segments BLS are formed using the straight line resist segments PRS as the mask, while the protruding segments BLDB are formed using the silicon dioxide discrete segments 24a as the mask. The straight photoresist is patterned by transferring the straight line segments PRS to the photoresist. Therefore, in the patterning step using a phase shifting mask, the interaction of the exposing rays passing through the adjacent openings is least likely to occur, and even when the adjacent segments of the pattern are arranged close to each other in the neighborhood of the critical limits of exposure resolution, the pattern resolution does not deteriorate, so that the formed pattern of lines is free of dilations or constrictions. The resulting effects are the reduction of defects caused by disconnections or short-circuits of the bit lines BL, and the improved yield of DRAMs. Since the second exposure is conducted independently of the first exposure, the protruding segments BLDB of the bit lines are not affected by the second exposure. Thus, it is possible to set the distance between the adjacent straight line segments BLS of the bit lines BL in the neighborhood of the critical limits of exposure resolution to thereby improve the degree of integration of DRAMs.

Next, the above-mentioned photoresist PRS is removed, and by performing the thermal oxidation process on the semiconductor substrate 1, a thin silicon dioxide film 26 is formed on the sidewalls of the polysilicon films 20 and 22, and the WSi$_2$ film 23, which together constitute the bit lines BL.

Figure 14A:
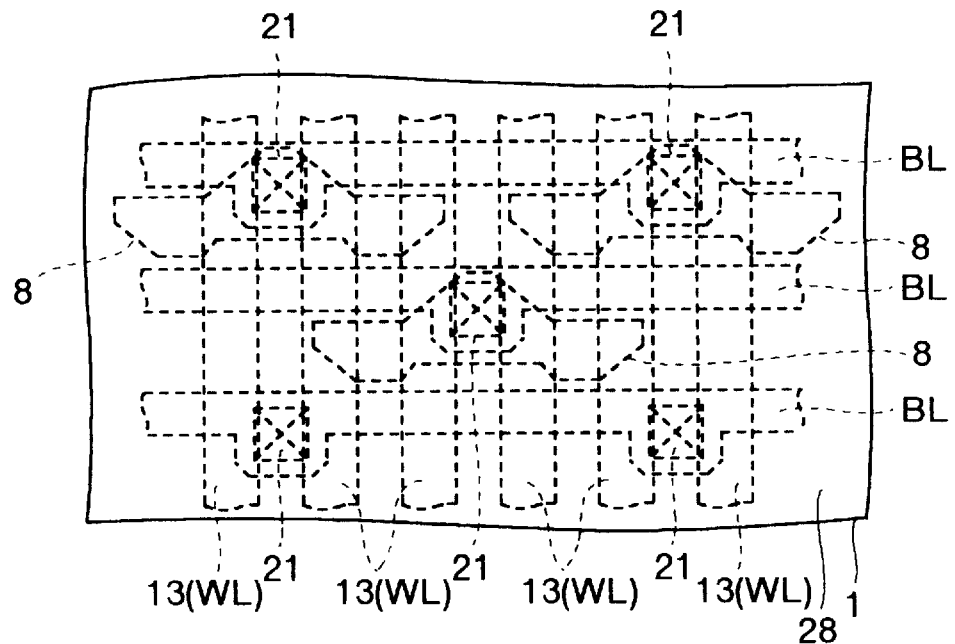
Figure 14B:
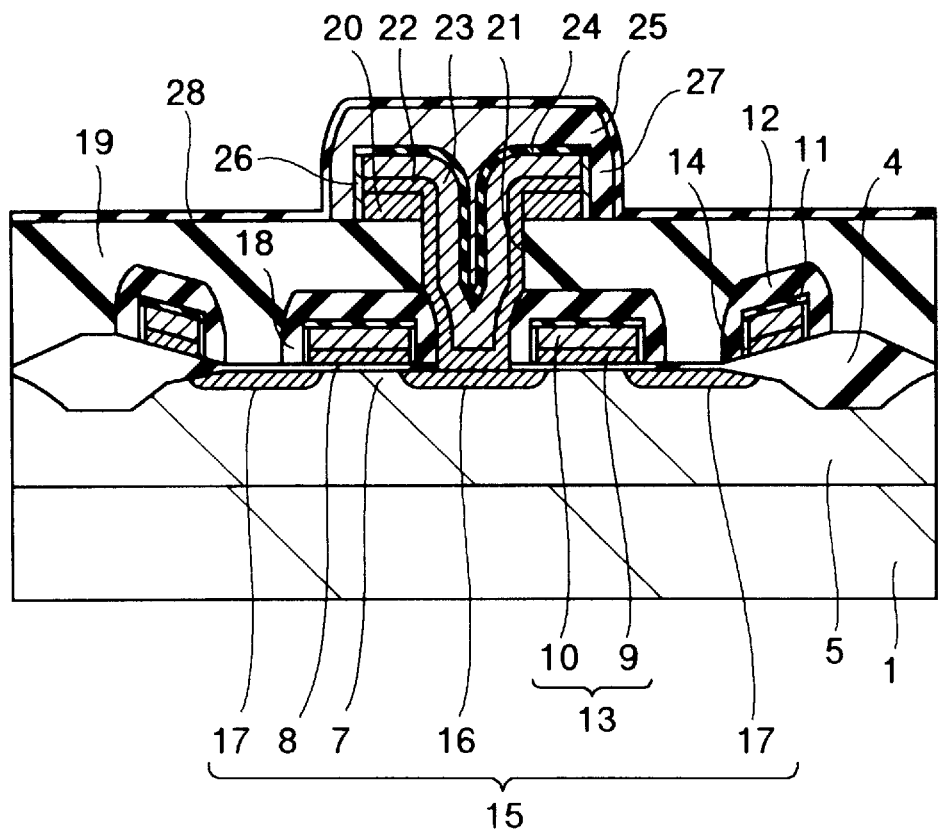

As shown in FIGS. 14a and 14b, a cap insulating film 25 made of silicon dioxide is formed on the WSi$_2$ film 23 and the discrete segment pattern 24a, and sidewall spacers 27 made of silicon dioxide are formed on the sidewalls of the bit lines BL. In the next step, a silicon nitride film 28 is deposited on the semiconductor substrate 1 by the CVD process. Because the cap insulating film 25 and the sidewall spacers 27 are made of silicon dioxide, the capacity of the bit line can be decreased and the detection sensitivity to stored charge can be improved.

The plan views of the DRAM are omitted in FIGS. 15 through 18 to be shown in the following.

Figure 15:
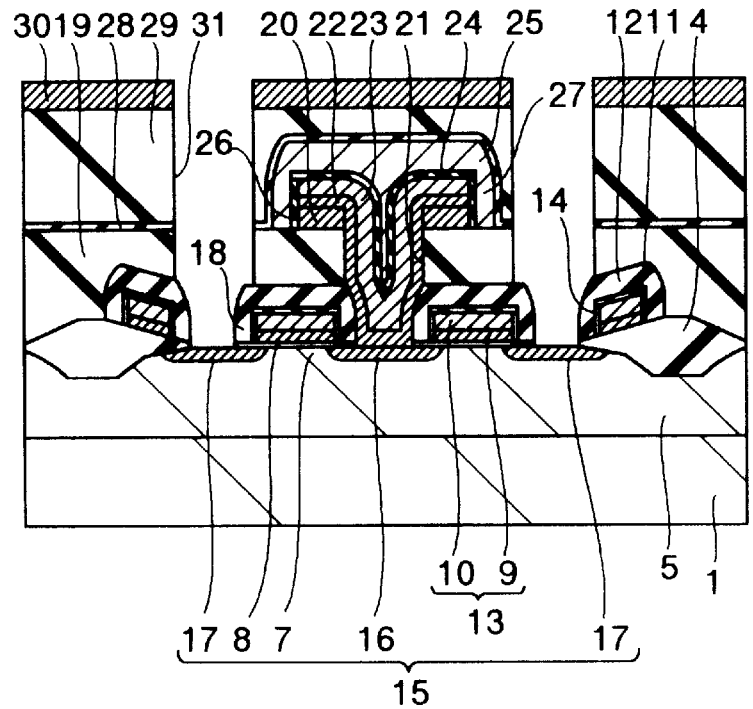

As shown in FIG. 15, after a silicon dioxide film 29 is deposited on the semiconductor substrate 1 by the CVD process, the surface of the silicon dioxide film 29 is flattened by the CMP process, for example, then a phosphorus doped polysilicon film 30 is deposited on the semiconductor substrate 1 by the CVD process.

Subsequently, the polysilicon film 30 is etched using a photoresist as a mask, then the photoresist is removed, and using the thus patterned polysilicon film 30 as a mask, the silicon dioxide film 29, the silicon nitride film 28, the insulating film 19 and a portion of the gate insulating film 8 are etched sequentially to thereby form a second contact hole 31 above the second semiconductor region 17 of each memory-cell-selecting MISFET.

Figure 16:
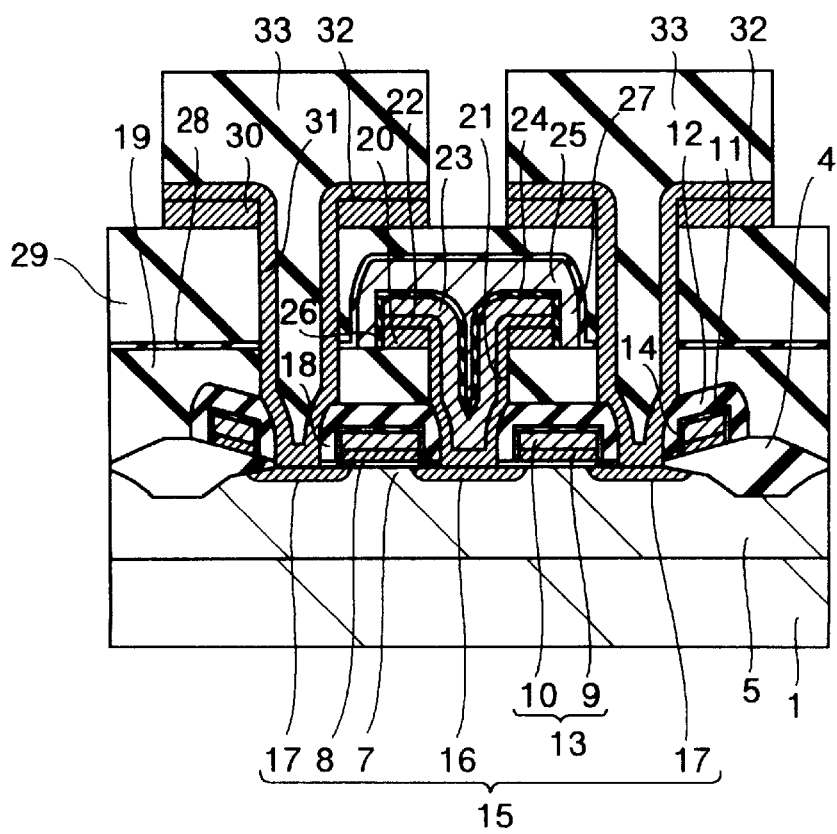

Then, as shown in FIG. 16, after removal of the photoresist, a p-type doped polysilicon film 32 and a silicon dioxide film 33 are deposited sequentially on the semiconductor substrate 1. The polysilicon film 32 is deposited also in the second contact hole 31 and connected to the second semiconductor region 17 of each memory-cell-selecting MISFET.

After that, the surface of the silicon dioxide film 33 is flattened by the CMP process, for example, then using a photoresist as a mask, the silicon dioxide film 33 is etched and subsequently, the polysilicon films 32 and 30 are etched sequentially. The etched polysilicon films 30 and 32 serve as a part of the storage nodes of the capacitors for information storage.

Figure 17:
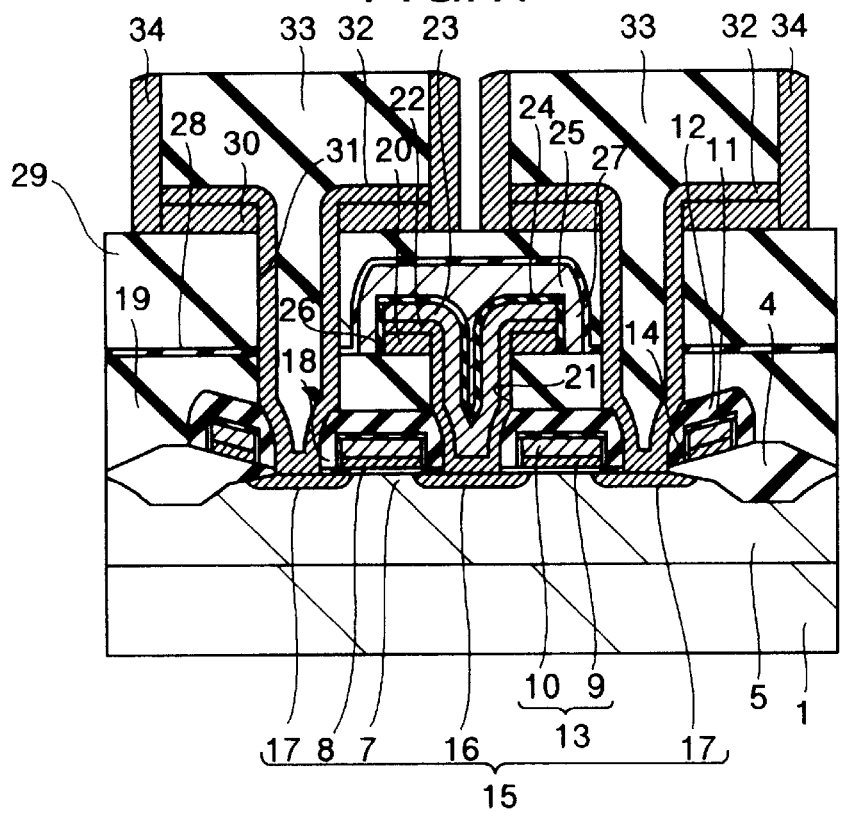

Then, after the photoresist is removed, as shown in FIG. 17, a conductive polysilicon film 34 is deposited on the semiconductor substrate 1 by the CVD process. Subsequently, the conductive polysilicon film 34 is etched by anisotropic etching, such as RIE, in such a manner as to leave the conductive polysilicon film 34 as a part of the storage nodes covering the sidewalls of the polysilicon films 30 and 32 and the silicon dioxide film 33.

Then, the silicon dioxide films 33 and 29 are etched away by wet etching with a solution of hydrofluoric acid, for example, to thereby form cylindrical storage nodes, each comprising the polysilicon films 30 and 32 and the conductive polysilicon film 34. In this etching step, the silicon nitride film 28 works as the etching stopper, preventing the insulating film 19 beneath from being etched.

Figure 18:
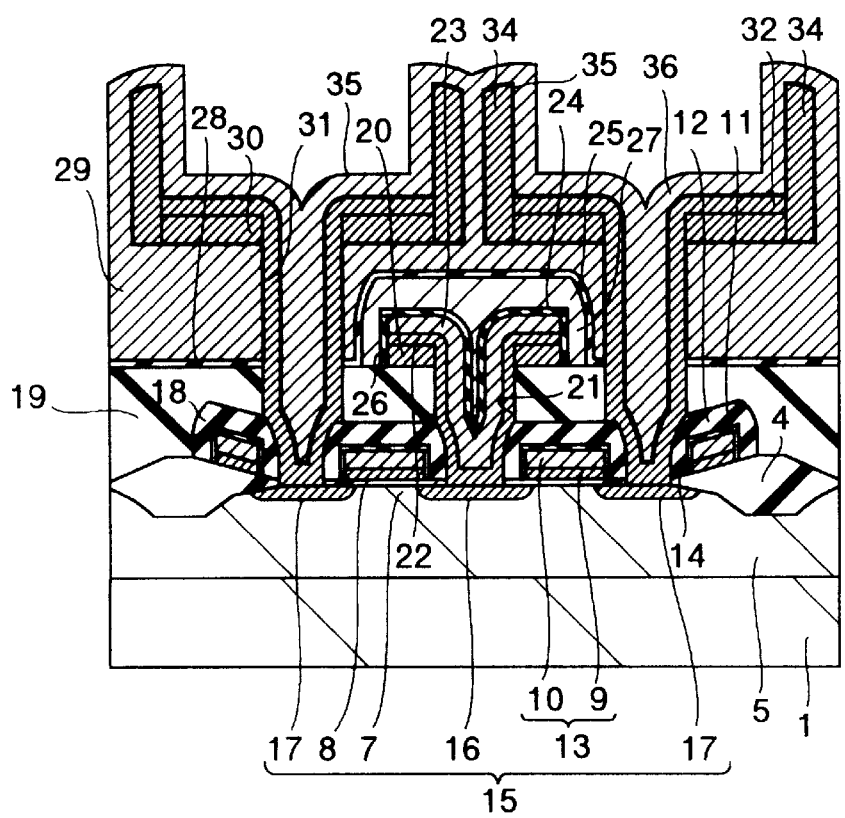

Then, as shown in FIG. 18, a silicon nitride film (not shown) is deposited on the semiconductor substrate 1 by the CVD process. After this, a silicon dioxide film is grown in the surface of the silicon nitride film by thermal oxidation so that the storage nodes are enclosed by a dielectric film 35 comprising the silicon dioxide film and the silicon nitride film. After this, a conductive polysilicon film (not shown) is deposited on the semiconductor substrate 1 by the CVD process, and by etching this conductive polysilicon film using a photoresist as the mask, a plate electrode 36 is formed.

Then, an interlayer insulating film (not shown) is deposited on the semiconductor substrate 1, and the surface of the interlayer insulating film is flattened by the CMP process, for example. After this, to form contact holes (not shown) for connecting metal lines, which are formed afterwards, with the bit lines of the memory cell array, the above-mentioned interlayer insulating film is etched using a photoresist as the mask.

Then, a metal film (not shown) of an aluminum alloy or WSi$_2$ is deposited on the semiconductor substrate 1, then this metal film is etched using a photoresist as the mask to thereby form metal lines. Finally, the surface of the semiconductor substrate 1 is covered with a passivation film (not shown), by which DRAM memory cells according to the first embodiment of the present invention are completed.

According to a DRAM and its manufacturing method in the first embodiment of the present invention, in patterning of the word lines WL and the bit lines BL, disconnections or short-circuits due to dilations and constrictions do not occur in the produced pattern, making it possible to improve the reliability, yield and the degree of miniaturization of DRAMs.

EMBODIMENT 2

Because the DRAM according to a second embodiment of the present invention has similar components to those of the DRAM in the first embodiment, detailed description of the DRAM is omitted, and only manufacturing steps according to a second embodiment which are different from those of Embodiment 1 will be described with reference to FIGS. 19a, 19b to 22a, 22b, in which FIGS. 19a to 22a show plan views of the DRAM memory cells and FIGS. 19b to 22b show sectional views of DRAM memory cells.

The steps from the formation of a LOCOS oxide film 4 on the semiconductor 1 to the formation of a silicon dioxide film 24 (FIGS. 4a, 4b to 11a, 11b) are similar to those in the first embodiment and their descriptions are omitted.

Figure 19A:
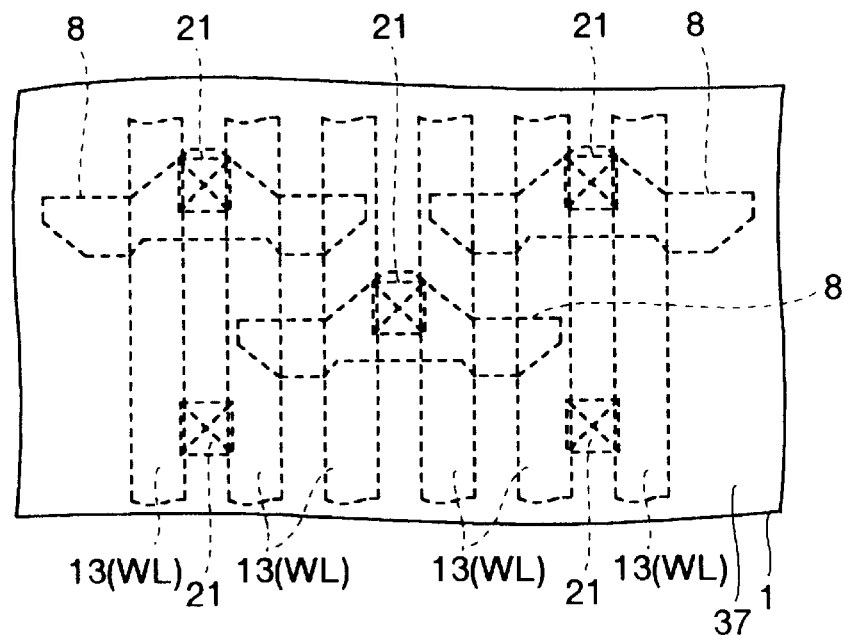
FIGS. 19a, 19b, 20a, 20b, 21a, 21b, 22a and 22b are plan views and sectional views at various manufacturing steps of a semiconductor device according to a second embodiment of the present invention.
Figure 19B:
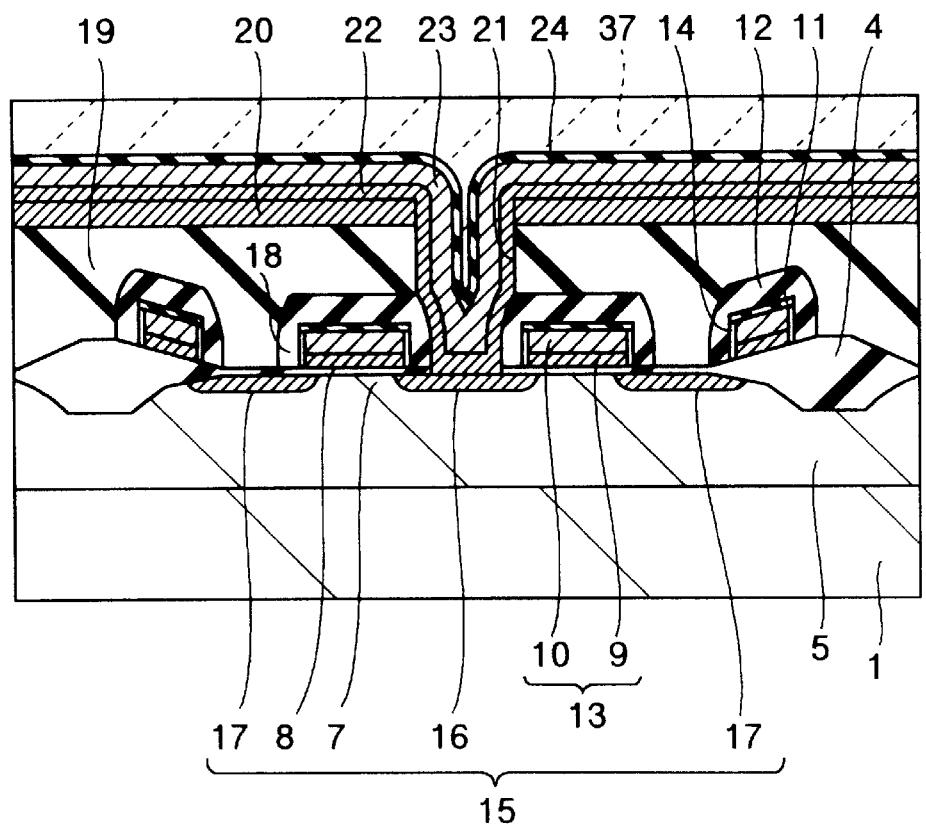

As shown in FIGS. 19a and 19b, a negative photoresist 37 is applied to the entire surface of the semiconductor substrate 1. The reason for using a negative resist is because the negative resist allows additional exposures for synthesis.

Figure 20A:
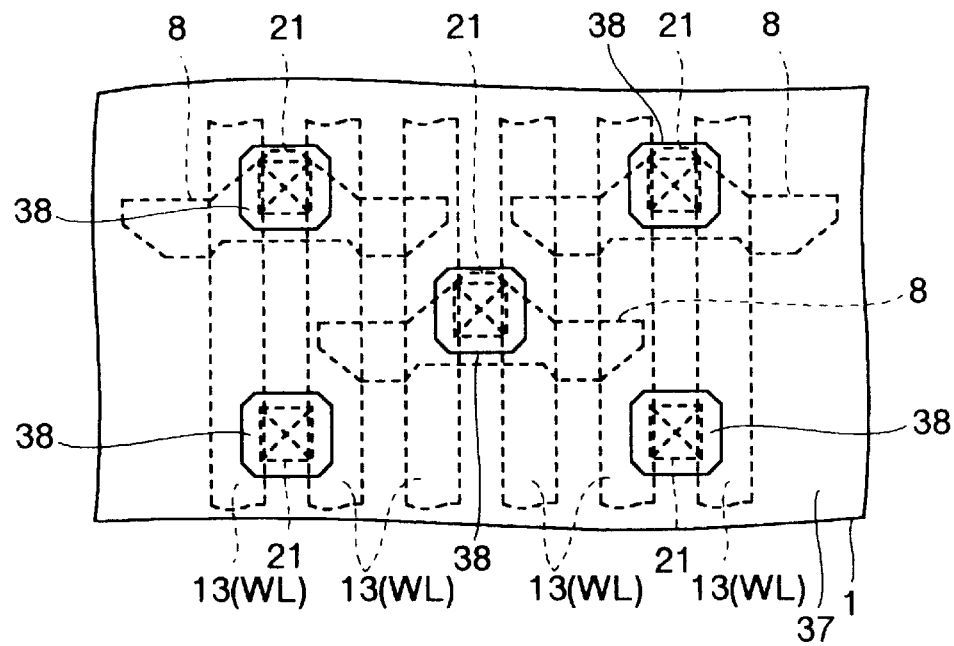
Figure 20B:
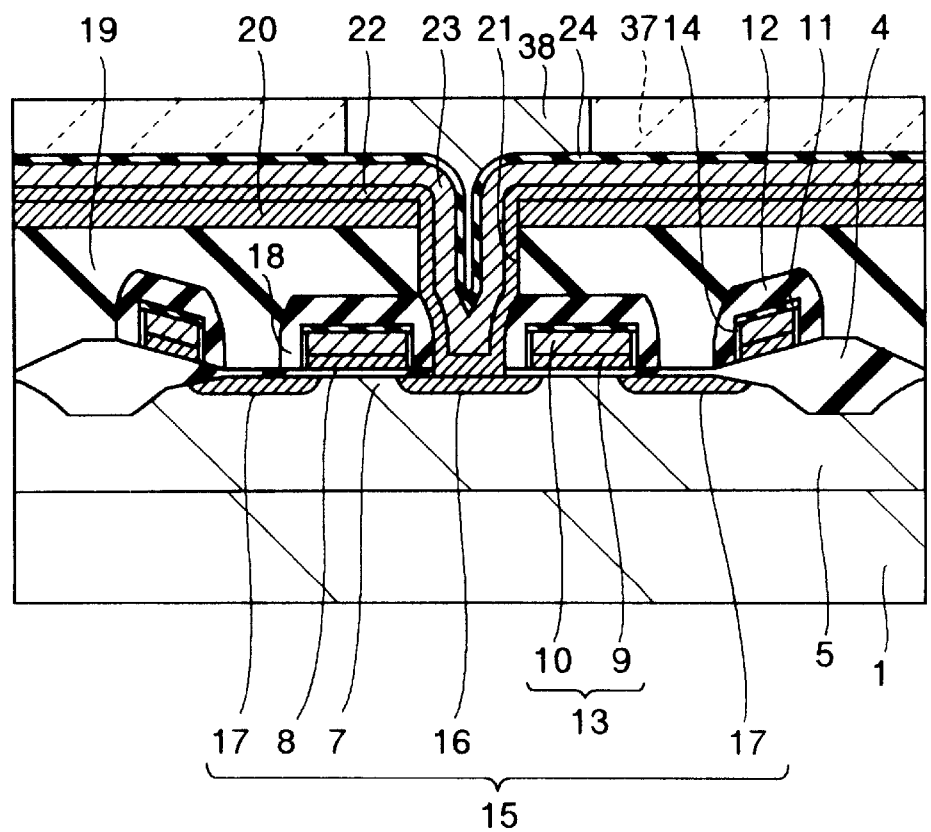

Then, as shown in FIGS. 20a and 20b, the first exposure using a first mask having discrete segments is done to form a discrete pattern 38 covering the first contact holes 21.

In FIG. 20a, in the first mask used for the first exposure, opaque parts, such as a layer of chrome (Cr), are not included in the discrete pattern 38 which cover the first contact holes 21, but the opaque parts, such as a layer of chrome (Cr), exist around the above-mentioned discrete pattern segments 38.

Therefore, when the photoresist 37 is exposed to light through the first mask, the exposure light strikes those portions of the photoresist 37 which correspond to the discrete segments 38 covering the first contact holes 21.

Figure 21A:
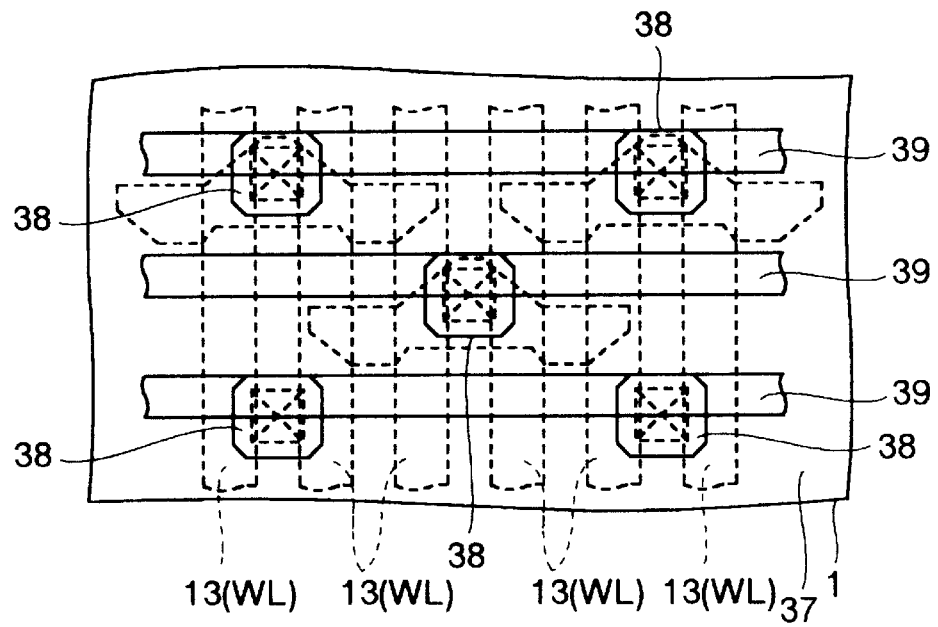
Figure 21B:
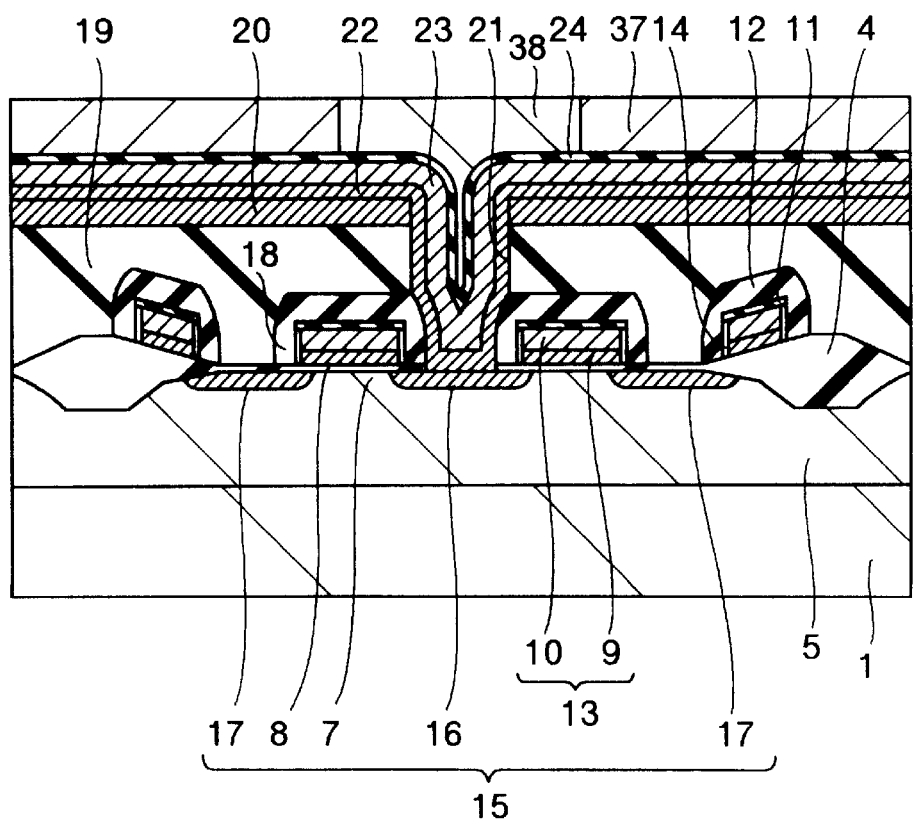

Then, as shown in FIGS. 21a and 21b, in the second exposure, an exposure is performed for the straight line segments 39 in such a way that the straight line segments partially overlap the discrete segments, so that by the double exposure the pattern of bit lines are defined as shown in FIG. 3.

In FIG. 21a, the second mask used for the second exposure is a phase shift mask, and in this phase shift mask, opaque parts, such as a layer of chrome (Cr), are not included in the straight line pattern segments 39, but the opaque parts, such as a layer of chrome (Cr), exist around the straight line segments 39. Needless to say, there are no discrete segments 38 in the second mask.

Therefore, when the photoresist 37 is exposed to light through the second mask, those portions of the photoresist 37 which correspond to the straight line segments 39 are exposed to light. The straight line segments 39 have their side edges in the longitudinal direction are straight lines parallel with each other.

As shown in FIG. 21a, the second mask is positioned such that the straight line segments 39 of the second mask partially overlap the discrete segments 38 of the first mask.

Since exposure is done twice, the photoresist is exposed to light twice at the overlapping portions of the discrete segments 38 and the straight line segment portions 39, but the photoresist is exposed to light once at the portions where the discrete segments 38 and the straight line segments 39 do not overlap. The photoresist is not exposed to light at the portions where there are neither the discrete segments 38 nor the straight line segments. In the developing step to be described later, those regions of the photoresist which were not exposed to light are removed.

In other words, after the developing step is finished, the resist pattern have a union of the discrete segments 38 and the straight line segments 39.

Note that the above two exposure steps may be performed in the reverse order. Specifically, the photoresist may be exposed to light firstly with the second mask having the straight line segments 39 and secondly with the first mask having the discrete segments 38.

Like in the first embodiment, in the first exposure, the discrete segments are spaced apart generally by a distance with a sufficient margin in comparison with the exposure resolution, and there is little possibility of the problem of pattern reproducibility encountered with the pattern transfer using a phase shift mask. Like in the first embodiment, the second exposure is for transferring the straight line segments to the photoresist, so that there is little possibility of interference between exposure lights for adjacent pattern segments in the pattern formation using a phase shifting mask. Thus, even if the adjacent pattern segments are close together in the neighborhood of the critical limits of exposure resolution, the pattern resolution does not deteriorate, leaving little possibility of dilations or constrictions to occur in the transferred pattern. The resulting effects are the reduction of defects caused by a disconnection or a short-circuit and the improvement of yield of DRAMs. Since the second exposure is done independently of the first exposure, even if there are protruding portions in the bit lines, they are not affected by the second exposure. Consequently, the distance between the adjacent straight line segments 39, which are formed by the second exposure, can be brought close together up to the neighborhood of the critical limits of exposure resolution, so that the degree of integration of DRAMs can be improved.

Figure 22A:
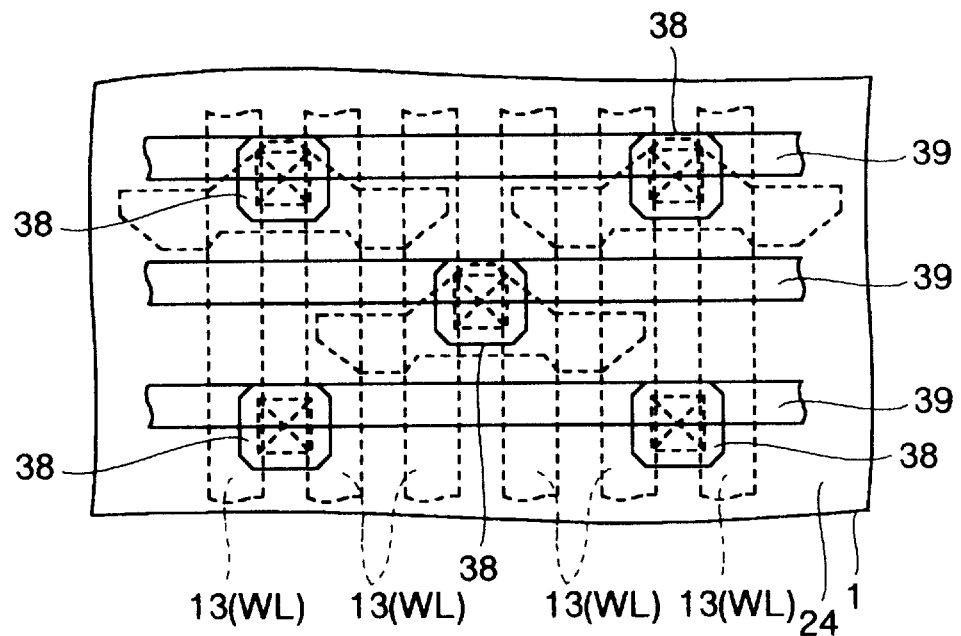
Figure 22B:
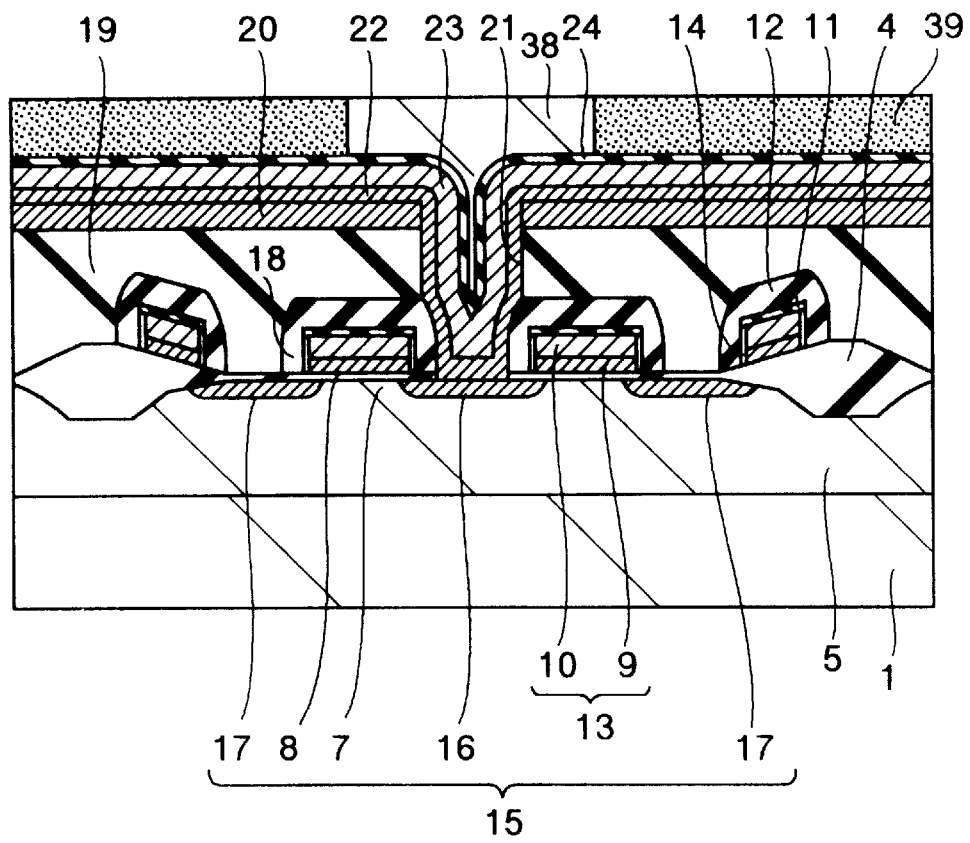

Then, as shown in FIGS. 22*a* and 22*b*, the photoresist 37 is developed so that the discrete segments 38 and the straight line segments 39 are formed in the resist. Using this resist pattern as the mask, the silicon dioxide film 24, the WSi$_2$ film 23, the polysilicon films 22 and 20 can be etched sequentially.

The subsequent steps are the same as in the first embodiment and their descriptions are omitted.

According to the DRAM manufacturing method in the second embodiment, in addition to the effects of the first embodiment, it is possible to form the bit lines by using only one sheet of photoresist 37, so that the manufacturing process can be simplified.

The present invention has been described with reference to preferred embodiments, but the present invention is not limited to the above-mentioned embodiments, and obviously many modifications and variations may be made without departing from the spirit and scope of the present invention.

For example, in the first and second embodiments, the bit lines are formed by exposure in two stages and the word lines WL are formed as the straight line segments by one exposure, but the word lines WL, too, may be formed by exposure in two stages. In this case, the width of the word lines WL may be widened only on the active regions, for example, which makes it possible to secure a sufficient channel length for the MOSFETs and improve the performance of the DRAMs.

In the first and second embodiments, description has been made of the manufacturing method for DRAM memory cells using a cylindrical storage node in the capacitor for information storage, but this manufacturing method is not limited to the memory cells with cylindrical storage nodes, but may be applied to a memory cell with a fin-type storage node or a memory cell of a simple stacked storage node, for example.

Further, in the first and second embodiments, description has been made of the manufacturing method for the memory cells of the COB structure having an information storage capacitor arranged over the bit line, but the manufacturing method of the present invention may be applied to memory cells having the bit line arranged over the information storage capacitor.

Further, in the first and second embodiments, a two-layer film of a silicon dioxide film and a silicon nitride film is used for the dielectric film of the information storage capacitor, but the present invention is not limited to this type of dielectric film, and a high dielectric film, such as a tantalum oxide film or a PZT (PbZrTiO$_x$) film, or a multilayer film of these films may be used.

In photolithography of the bit lines or the word lines using the phase shifting mask, the discrete segments and the straight line segments are formed separately by exposure in two stages, for which reason, even if adjacent pattern lines of the bit lines or word lines are close, the patterned lines are prevented from being dilated or constricted. In other words, it is possible to perform patterning while utilizing the photolithographic techniques of late to the full. It is also possible to absorb the individual differences of the steppers to thereby stabilize the characteristics of the devices at the stage of mass production. Therefore, it has become possible to reduce defects and improve the reliability and yield of the semiconductor integrated circuit devices, and pursue a higher degree of integration.

What is claimed is:

1. A method of manufacturing a semiconductor integrated circuit device including an array of memory cells, a plurality of word lines formed at fixed intervals over a semiconductor substrate and functioning as gate electrodes of transistors for selecting memory cells, a plurality of bit lines formed at fixed intervals and extending in such as manner as to intersect said word lines, and a plurality of active regions surrounded by a field insulating film, wherein each of said active regions includes a first semiconductor region shared by two memory-cell-selecting transistors located in a center of said active region, two second semiconductor regions located at both side end portions of said active region, and two channel-forming regions, one channel-forming region being located between one second semiconductor region and the first semiconductor region and the other channel-forming region being located between the first semiconductor region and the other second semiconductor region, the method comprising the steps of:

forming, over a first film, a second film having an etch rate different from that of said first film serving as said word lines or bit lines;

patterning said second film to a first pattern of discrete segments;

forming a resist film having a second pattern of straight line segments at least partially overlapping said discrete segments on said patterned first film; and patterning said first film using as a mask said first pattern of discrete segments of said second film and said second pattern of straight line segments of said resist film.

2. A method of manufacturing a semiconductor integrated circuit device including a plurality of word lines formed at fixed intervals over a semiconductor substrate and functioning as gate electrodes of transistors for selecting memory cells, a plurality of bit lines formed at fixed intervals and extending in such as manner as to intersect said word lines, and a plurality of active regions surrounded by a field insulating film, wherein each said active region includes a first semiconductor region shared by two memory-cell-selecting transistors located in a center of said active region, two second semiconductor regions located at both side end portions of said active region, and two channel-forming regions, one being located between one second semiconductor region and the first semiconductor region and the other being located between the first semiconductor region and the other second semiconductor region, the method comprising the steps of:

forming a film serving as said word lines or bit lines over said semiconductor substrate;

forming a negative photoresist film on an upper surface of said film;

exposing said photoresist film to light through a first mask to transfer discrete segments to said photoresist, and further exposing said exposed photoresist film to light through a second mask to transfer straight line segments to said photoresist film, with said straight line segment at least partially overlapping said discrete segment pattern;

developing said twice exposed photoresist film to form a resist pattern; and patterning said film using said resist pattern as a mask.

3. A method of manufacturing a semiconductor integrated circuit device, comprising the steps of:

forming a first conductor film over a semiconductor substrate with a first insulating film interposed therebetween;

forming a second insulating film on said first conductor film;

applying a first resist film onto said second insulating film;

preparing a first mask having discrete pattern segments;

exposing said resist film to light through said first mask;

developing said exposed first resist film;

patterning said second insulating film, using said developed first resist film, to a first pattern of discrete segments;

removing said first resist film;

applying a second resist film onto said first conductor film and onto said patterned second insulating film;

preparing a second mask having straight line pattern segments, each of said straight line pattern segments having lengthwise side edges in the form of a straight lines parallel with each other, said second mask being a phase shifting mask;

registering said second mask in such a manner that said straight line pattern segments in said second mask are, when projected onto said semiconductor substrate, at least partly overlapped with said first pattern of discrete segments of said second insulating film;

exposing said second resist film to light through said second, phase shifting, mask;

developing said exposed second resist film to provide a second pattern of straight line segments of said second insulating film; and patterning said first conductor film, using said developed second resist film and said patterned second insulating film, whereby said first conductor film is in a pattern synthesized from said discrete pattern segments in said first mask and said straight line pattern segments in said second mask.

4. A method of manufacturing a semiconductor integrated circuit device, comprising the steps of:

forming a first conductor film over a semiconductor substrate with a first insulating film interposed therebetween;

forming a second insulating film on said first conductor film;

applying a negative resist film onto said second insulating film;

preparing a first mask having discrete pattern segments;

exposing said negative resist film to light through said first mask to transfer said discrete pattern segments onto said negative resist film;

preparing a second mask having straight line pattern segments, each of said straight line pattern segments having lengthwise side edges in the form of a straight lines parallel with each other, said second mask being a phase shifting mask;

registering said second mask in such a manner that said straight line segments in said second mask are, when projected onto said exposed resist film, at least partly overlapped with said discrete pattern segments in said exposed resist film;

further exposing said negative resist film to light through said second, phase shifting, mask to transfer said straight line pattern segments onto said negative resist film;

developing the double-exposed negative resist film; and patterning said first conductor film, using said developed negative resist film, whereby said first conductor film is in a pattern synthesized from said discrete pattern segments in said first mask and said straight line pattern segments in said second mask.

* * * * *